United States Patent
Kodama et al.

(10) Patent No.: US 11,126,086 B2
(45) Date of Patent: Sep. 21, 2021

(54) SUBSTRATE TREATMENT APPARATUS, SUBSTRATE TREATMENT METHOD, AND COMPUTER STORAGE MEDIUM

(71) Applicant: Tokyo Electron Limited, Tokyo (JP)

(72) Inventors: Teruhiko Kodama, Koshi (JP); Koichi Matsunaga, Koshi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/231,659

(22) Filed: Dec. 24, 2018

(65) Prior Publication Data
US 2019/0212653 A1 Jul. 11, 2019

(30) Foreign Application Priority Data
Jan. 5, 2018 (JP) ............................. JP2018-000416

(51) Int. Cl.
*G03F 7/34* (2006.01)
*H01L 21/027* (2006.01)
(Continued)

(52) U.S. Cl.
CPC .............. *G03F 7/34* (2013.01); *G03F 7/162* (2013.01); *G03F 7/167* (2013.01); *G03F 7/168* (2013.01); *G03F 7/2004* (2013.01); *G03F 7/38* (2013.01); *G03F 7/70* (2013.01); *H01L 21/0274* (2013.01); *H01L 21/6715* (2013.01); *H01L 21/6773* (2013.01); *H01L 21/67103* (2013.01); *H01L 21/67115* (2013.01); *H01L 21/67178* (2013.01); *H01L 21/6833* (2013.01); *H01L 21/68742* (2013.01)

(58) Field of Classification Search
CPC .......... G03F 7/162; G03F 7/167; G03F 7/168; G03F 7/2004; G03F 7/34; G03F 7/39; H01L 21/6715
See application file for complete search history.

(56) References Cited

U.S. PATENT DOCUMENTS

2009/0277871 A1* 11/2009 Berry ................ H01J 37/32449
216/37
2013/0319272 A1* 12/2013 Tanaka ..................... B41K 1/54
101/333
(Continued)

FOREIGN PATENT DOCUMENTS

JP  H09-186224 A  7/1997
JP  2011-171732 A  9/2011
(Continued)

OTHER PUBLICATIONS

Machine translation of KR100777467, captured from Espacenet (Year: 2020).*

*Primary Examiner* — Dah-Wei D. Yuan
*Assistant Examiner* — Stephen A Kitt
(74) *Attorney, Agent, or Firm* — Posz Law Group

(57) ABSTRACT

A substrate treatment apparatus for applying a coating solution to a front surface of a substrate and developing an exposed coating film on the front surface of the substrate, includes a film forming unit configured to form a friction reducing film on a rear surface of the substrate before exposure processing, the friction reducing film reducing friction between the rear surface of the substrate and a holding surface for holding the rear surface of the substrate in the exposure processing.

18 Claims, 16 Drawing Sheets

(51) Int. Cl.
*H01L 21/677* (2006.01)
*G03F 7/20* (2006.01)
*G03F 7/16* (2006.01)
*H01L 21/683* (2006.01)
*H01L 21/67* (2006.01)
*H01L 21/687* (2006.01)
*G03F 7/38* (2006.01)

(56) References Cited

U.S. PATENT DOCUMENTS

2016/0043007 A1* 2/2016 Fonseca .............. G03F 7/70783
 438/7
2018/0025899 A1* 1/2018 Kang ................ H01L 21/02016
 216/89

FOREIGN PATENT DOCUMENTS

| JP | 2013-191601 A | 9/2013 |
| JP | 2017-69271 A | 4/2017 |
| KR | 100777467 B1 * | 11/2007 |

* cited by examiner

SUBSTRATE TREATMENT APPARATUS, SUBSTRATE TREATMENT METHOD, AND COMPUTER STORAGE MEDIUM

CROSS REFERENCE TO RELATED APPLICATIONS

This application is based upon and claims the benefit of priority of the prior Japanese Patent Application No. 2018-416, filed in Japan on Jan. 5, 2018, the entire contents of which are incorporated herein by reference.

BACKGROUND OF THE INVENTION

1. Field of the Invention

This disclosure relates to a substrate treatment apparatus, a substrate treatment method, and a computer storage medium.

2. Description of the Related Art

In a manufacturing process of, for example, a semiconductor device having a multilayer wiring structure, for example, a photolithography process of forming a resist pattern on a semiconductor wafer (hereinafter, referred to as a "wafer") is performed a plurality of times. In the photolithography process, a resist coating treatment of applying a resist solution onto the wafer to form a resist film, exposure processing of exposing the resist film to a predetermined pattern, a developing treatment of developing the exposed resist film and so on are performed to form a predetermined resist pattern on the wafer.

Between the photolithography processes, the exposure processing is performed so that a shot is performed in the same region of the wafer. For miniaturization of the resist pattern accompanying higher integration of the semiconductor device in recent years, the accuracy of aligning the region where the shot is performed in the preceding photolithography process and the region where the shot is performed in the subsequent photolithography process, namely, the accuracy of overlay (superposition) is required to be increased.

Hence, for example, Japanese Laid-open Patent Publication No. 2011-171732, there is a suggested method for detecting the error of the overlay using a scatterometer and thereby controlling the operation of a scanner for performing exposure.

SUMMARY OF THE INVENTION

Incidentally, in the exposure processing, the wafer transferred to an exposure apparatus is once delivered, for example, to three raising and lowering pins, and then mounted on a stage. Then, the shot is performed in a state where the wafer is suction-held on the stage and the position of the wafer on the stage is fixed.

However, since the wafer W delivered to the raising and lowering pins bends downward under its own weight at the outer peripheral portion as compared to the center portion, the wafer is mounted on the stage in sequence from the outer peripheral portion toward the center portion. In that case, the outer peripheral portion of the wafer is first suction-held on the stage, and therefore the wafer is suction-held with stress placed on the center portion. Besides, the wafer itself transferred to the exposure apparatus is not originally flat but may be distorted and, in this case, the wafer is also suction-held with stress placed thereon. When the wafer is suction-held on the stage with stress placed thereon, the wafer is deformed and the shot may be performed in a region displaced from a desired region.

In this regard, in above-described Japanese Laid-open Patent Publication No. 2011-171732, no attention is focused on the above-described problem when mounting the wafer on the stage, and the shot is not performed at an appropriate position in some cases. Accordingly, there is room for improvement in increasing the accuracy of overlay of the exposure processing.

A technique according to this disclosure is made in consideration of the above circumstances and performs exposure processing at an appropriate position in a photolithography process.

An aspect of this disclosure solving the above problem is a substrate treatment apparatus for applying a coating solution to a front surface of a substrate and developing an exposed coating film on the front surface of the substrate, the substrate treatment apparatus including a film forming unit configured to form a friction reducing film on a rear surface of the substrate before exposure processing, the friction reducing film reducing friction between the rear surface of the substrate and a holding surface for holding the rear surface of the substrate in the exposure processing.

According to one aspect of this disclosure, by forming the friction reducing film on the rear surface of the substrate before the exposure processing, the friction reducing film formed on the rear surface of the substrate comes into contact with the stage when the substrate is mounted on the stage in the exposure processing. Then, even in the case where the outer peripheral portion of the substrate bends downward as compared with the center portion, for example, due to raising and lowering pins or in the case where the substrate to be transferred to the exposure apparatus is not flat, the substrate can be mounted in a manner to slide on the stage owing to the friction reducing film, thereby reducing the stress placed on the substrate as in the prior art. Accordingly, it is possible to suction-hold the substrate at an appropriate position on the state so as to restrain the displacement, from the normal position, of the position where the substrate is exposed to light. As a result, the overlay of the exposure processing can be improved.

An aspect of this disclosure according to another viewpoint is a substrate treatment method for applying a coating solution to a front surface of a substrate and developing an exposed coating film on the front surface of the substrate, the substrate treatment method including a film forming step of forming a friction reducing film on a rear surface of the substrate before exposure processing, the friction reducing film reducing friction between the rear surface of the substrate and a holding surface for holding the rear surface of the substrate in the exposure processing.

An aspect of this disclosure according to still another viewpoint is a computer-readable storage medium storing a program running on a computer of a control unit configured to control a substrate treatment apparatus so as to cause the substrate treatment apparatus to execute the substrate treatment method.

According to one aspect of this disclosure, the exposure processing can be performed at an appropriate position in the photolithography process.

DETAILED DESCRIPTION OF THE INVENTION

Figure 1:
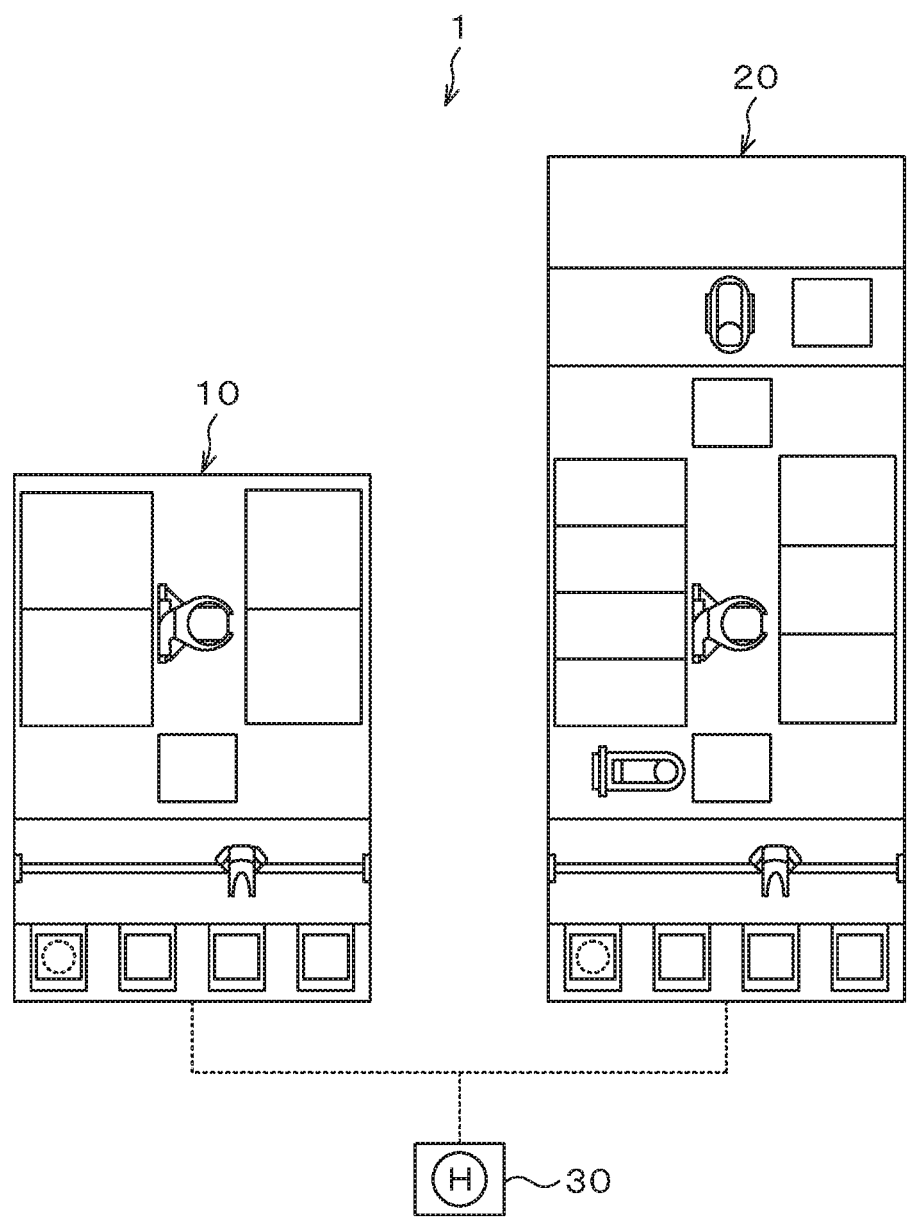
FIG. 1 is a plan view schematically illustrating the outline of a configuration of a substrate treatment system according to a first embodiment.

Hereinafter, embodiments will be explained referring to the drawings. Note that in the description and the drawings, the same codes are given to components having substantially the same functional configurations to omit duplicated explanation.

First Embodiment

First, a configuration of a substrate treatment system (substrate treatment apparatus in this disclosure) according to a first embodiment will be described. FIG. 1 is a plan view schematically illustrating the outline of the configuration of a substrate treatment system 1 according to this embodiment.

(Substrate Treatment System)

The substrate treatment system 1 includes two treatment systems 10, 20 which perform predetermined treatments on a wafer W as a substrate. The substrate treatment system 1 is further provided with a control unit 30. The control unit 30 is, for example, a computer and includes a program storage unit (not illustrated). In the program storage unit, a program for controlling the treatments on the wafer W in the substrate treatment system 1 is stored. The program may be the one that is recorded, for example, in a computer-readable storage medium such as a computer-readable hard disk (HD), flexible disk (FD), compact disk (CD), magneto-optical disk (MO), or memory card, and installed from the storage medium into the control unit 30. The configuration of the substrate treatment system 1 in this embodiment is, but not limited to, an example for implementing a wafer treatment method in this disclosure.

(First Treatment System)

Figure 2:
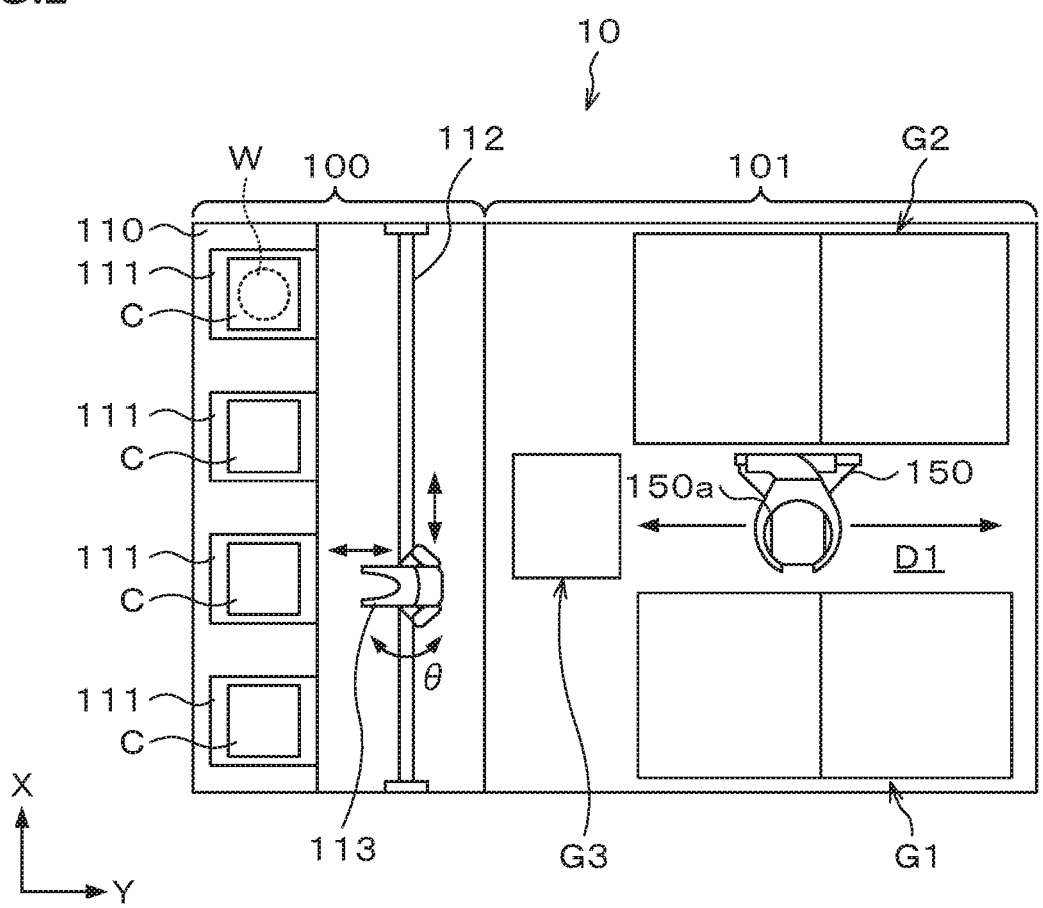
FIG. 2 is a plan view schematically illustrating the outline of a configuration of a first treatment system according to the first embodiment.
Figure 3:
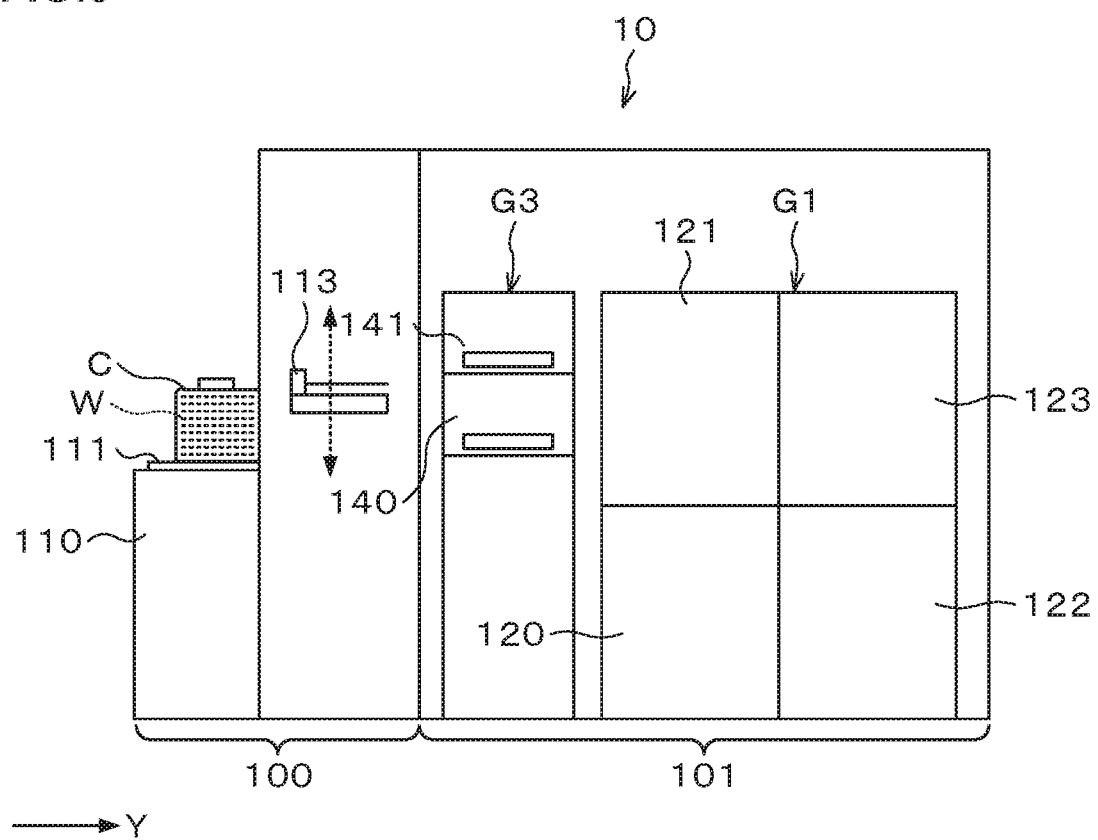
FIG. 3 is a front view schematically illustrating the outline of the internal configuration of the first treatment system according to the first embodiment.
Figure 4:
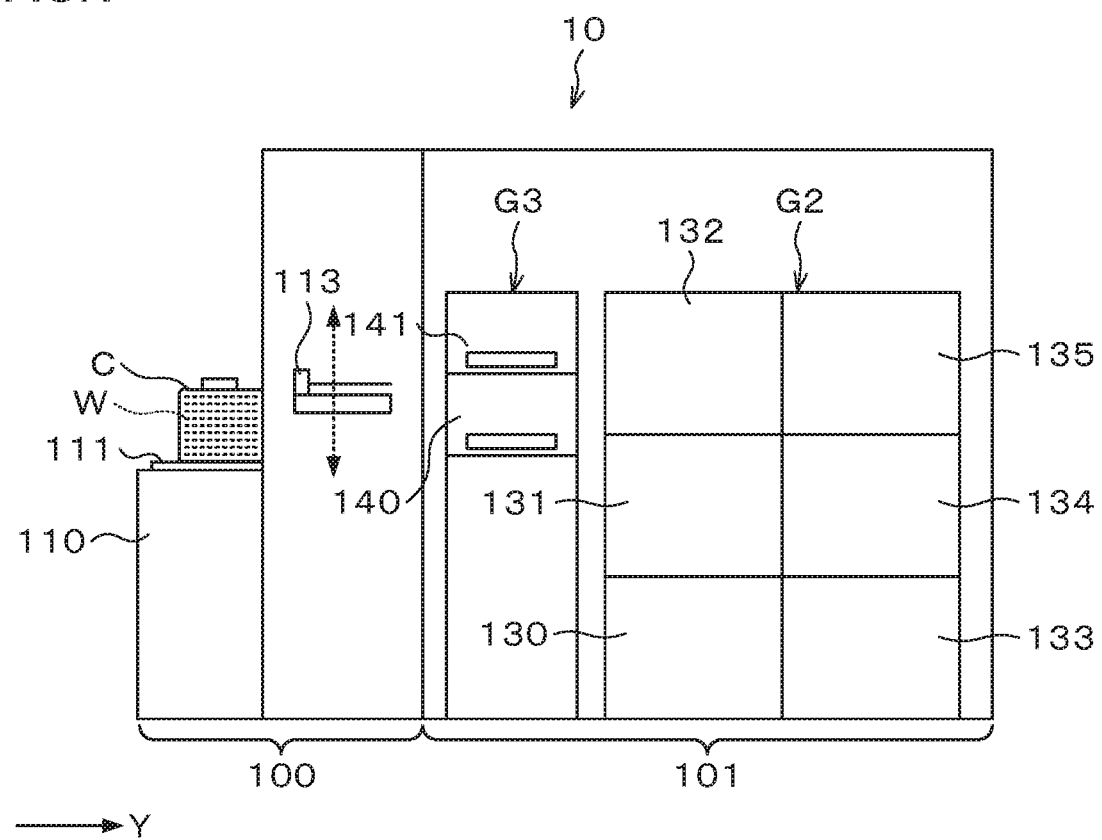
FIG. 4 is a rear view schematically illustrating the outline of the internal configuration of the first treatment system according to the first embodiment.

A configuration of the first treatment system 10 will be described. FIG. 2 is a plan view schematically illustrating the outline of the configuration of the first treatment system 10. FIG. 3 and FIG. 4 are a front view and a rear view schematically illustrating the outline of the internal configuration of the first treatment system 10, respectively.

The first treatment system 10 has, as illustrated in FIG. 2, a configuration in which a cassette station 100 into/out of which a cassette C housing a plurality of wafers W is transferred and a treatment station 101 which includes a plurality of treatment apparatuses performing predetermined treatments on the wafer W, are integrally connected.

In the cassette station 100, a cassette mounting table 110 is provided. The cassette mounting table 110 is provided with a plurality of cassette mounting plates 111 on which the cassettes C are mounted when the cassettes C are transferred in/out from/to the outside of the substrate treatment system 1.

In the cassette station 100, a wafer transfer apparatus 113 is to provided which is movable on a transfer path 112 extending in an X-direction. The wafer transfer apparatus 113 is movable also in a vertical direction and around a vertical axis (in a θ-direction), and can transfer the wafer W between the cassette C on each of the cassette mounting plates 111 and later-described delivery apparatuses 140, 141 in a third block G3 in the treatment station 101.

In the treatment station 101, a plurality of, for example, three blocks each including various apparatuses, namely, a first block G1 to a third block G3 are provided. For example, the first block G1 is provided on the front side (X-direction negative direction side in FIG. 2) in the treatment station 101, and the second block G2 is provided on the rear side (X-direction positive direction side in FIG. 2, the upper side in the drawing) in the treatment station 101. Further, the third block G3 is provided on the cassette station 100 side (Y-direction negative direction side in FIG. 2) in the treatment station 101.

In the first block G1, as illustrated in FIG. 3, rear surface cleaning apparatuses 120, 121 each of which cleans the rear surface of the wafer W, a lower-layer film forming apparatus 122 which applies a material for a lower-layer film onto the front surface of the wafer W to form a lower-layer film, for example, an SOC (Spin On Carbon) film, and a catalyst treatment apparatus 123 which supplies a predetermined catalyst to a later-described friction reducing film formed on the rear surface of the wafer W to treat the friction reducing film are provided. The rear surface cleaning apparatuses 120, 121 are arranged in this order from the bottom, the lower-layer film forming apparatus 122 and the catalyst treatment apparatus 123 are arranged in this order from the bottom, and the rear surface cleaning apparatuses 120, 121, and the lower-layer film forming apparatus 122 and the catalyst treatment apparatus 123 are arranged in this order from the cassette station 100 side. Note that the numbers and the arrangements of these rear surface cleaning apparatuses 120, 121, lower-layer film forming apparatus 122 and catalyst treatment apparatus 123 can be arbitrarily selected. Further, the catalyst treatment in the catalyst treatment apparatus 123 may be performed in a later-described friction reducing film forming apparatus 133 depending on the kind of the catalyst to be used, and in this case, the catalyst treatment apparatus 123 can be omitted.

In the second block G2, as illustrated in FIG. 4, thermal treatment apparatuses 130 to 132 each of which performs thermal treatments such as heating and cooling on the wafer W, the friction reducing film forming apparatus 133 which forms the friction reducing film on the rear surface of the wafer W, and ultraviolet processing apparatuses 134, 135 each of which irradiates the rear surface of the wafer W with an ultraviolet ray are provided. The thermal treatment apparatuses 130 to 132 are arranged in this order from the bottom, the friction reducing film forming apparatus 133 and the ultraviolet processing apparatuses 134, 135 are arranged in this order from the bottom, and the thermal treatment apparatuses 130 to 132, and the friction reducing film forming apparatus 133 and the ultraviolet processing apparatuses 134, 135 are arranged in this order from the cassette station 100 side. Note that, in this embodiment, the friction reducing film forming apparatus 133 constitutes a film forming unit in this disclosure, and the ultraviolet processing apparatuses 134, 135 constitute a pre-treatment unit and a film peeling unit in this disclosure, respectively. Further, the numbers and the arrangements of these thermal treatment apparatuses 130 to 132, friction reducing film forming apparatus 133, and ultraviolet processing apparatuses 134, 135 can be arbitrarily selected.

In the third block G3, delivery apparatuses 140, 141 are provided in this order from the bottom.

As illustrated in FIG. 2, a wafer transfer region D1 is formed in a region surrounded by the first block G1 to the third block G3. In the wafer transfer region D1, for example, a plurality of wafer transfer apparatuses 150 are arranged each of which has a transfer arm 150a movable, for example, in the Y-direction, the X-direction, the θ-direction, and the vertical direction. The wafer transfer apparatus 150 can move in the wafer transfer region D1 to transfer the wafer W to a predetermined apparatus in the first block G1, the second block G2, and the third block G therearound.

(Second Treatment System)

Figure 5:
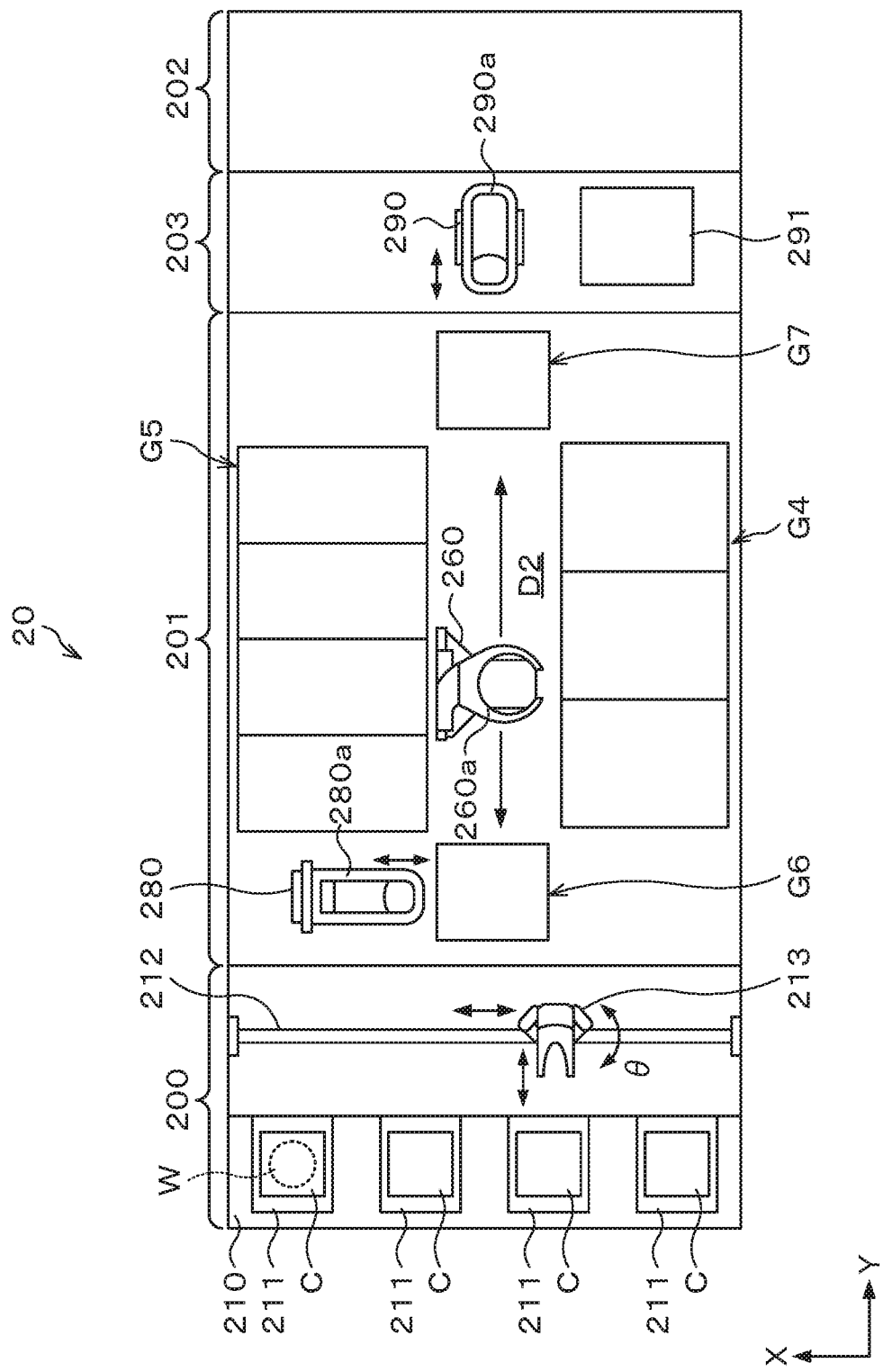
FIG. 5 is a plan view schematically illustrating the outline of a configuration of a second treatment system according to the first embodiment.
Figure 6:
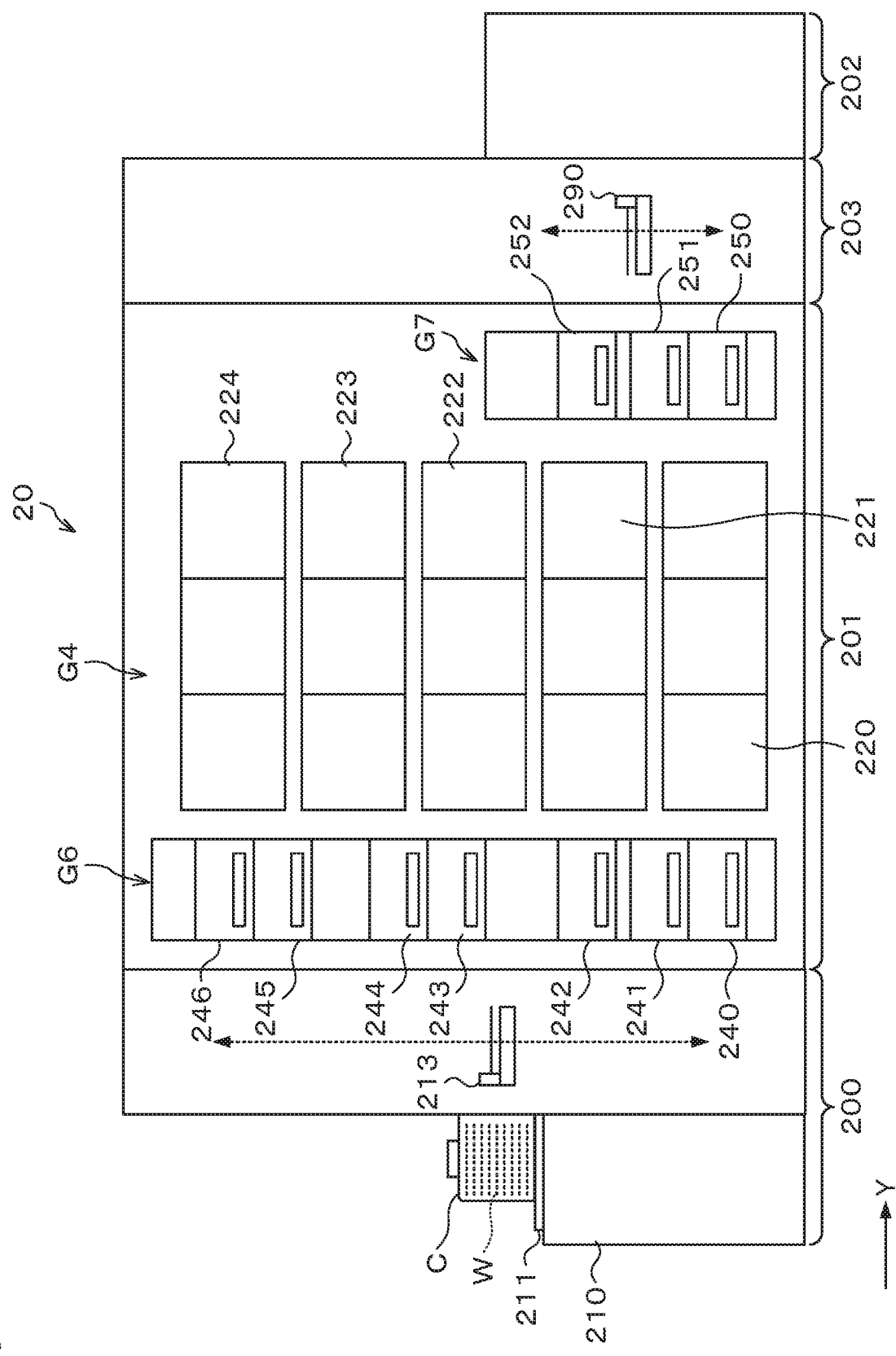
FIG. 6 is a front view schematically illustrating the outline of the internal configuration of the second treatment system according to the first embodiment.
Figure 7:
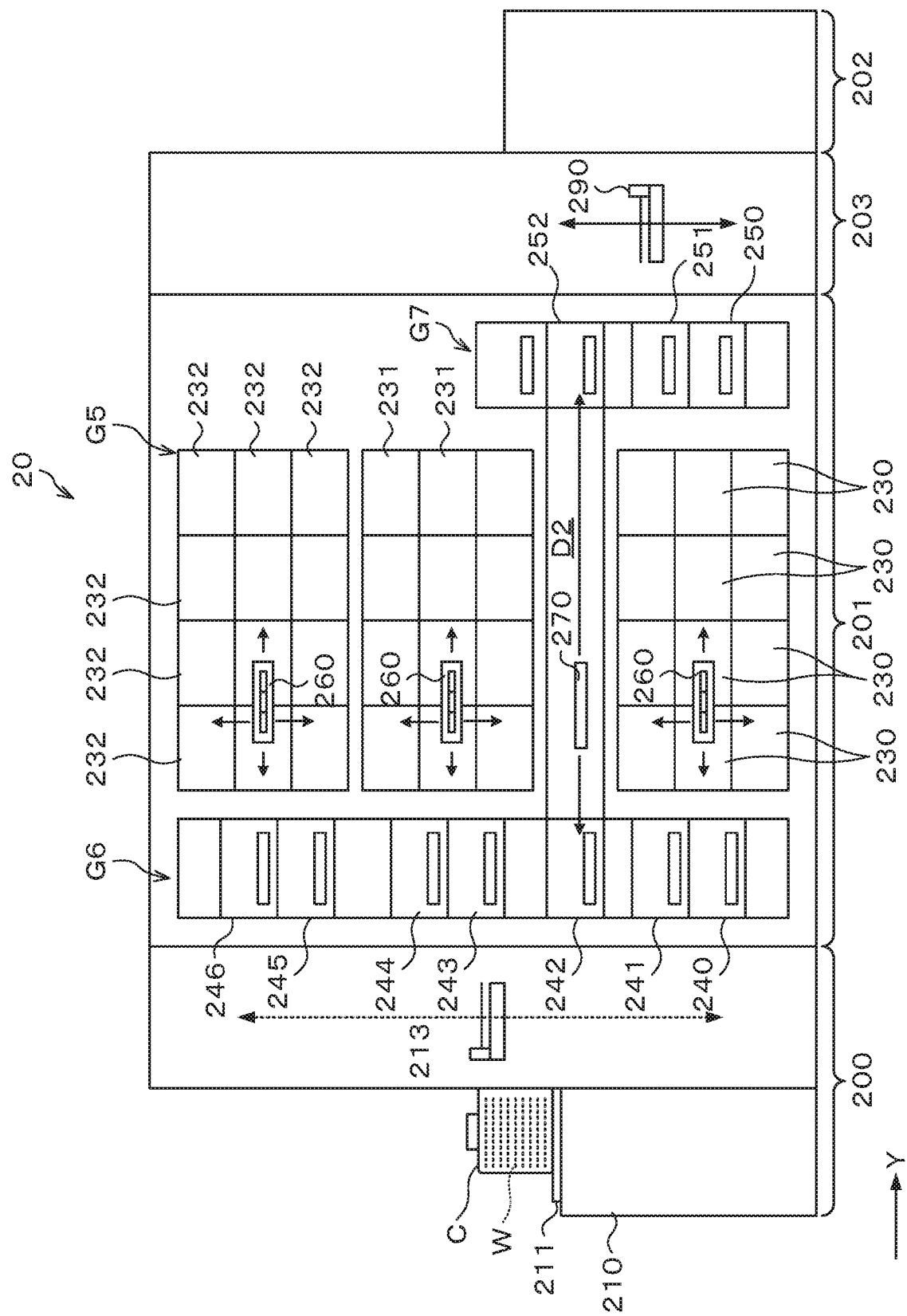
FIG. 7 is a rear view schematically illustrating the outline of the internal configuration of the second treatment system according to the first embodiment.

A configuration of the second treatment system 20 will be described. FIG. 5 is a plan view schematically illustrating the outline of the configuration of the second treatment system 20. FIG. 6 and FIG. 7 are a front view and a rear view schematically illustrating the outline of the internal configuration of the second treatment system 20, respectively.

The second treatment system 20 has, as illustrated in FIG. 5, a configuration in which a cassette station 200 into/out of which a cassette C housing a plurality of wafers W is transferred, a treatment station 201 which includes a plurality of treatment apparatuses performing predetermined treatments on the wafer W, and an interface station 203 which delivers the wafer W to/from an exposure apparatus 202 adjacent to the treatment station 201, are integrally connected.

In the cassette station 200, a cassette mounting table 210 is provided. The cassette mounting table 210 is provided with a plurality of cassette mounting plates 211 on which the cassettes C are mounted when the cassettes C are transferred in/out from/to the outside of the substrate treatment system 1.

In the cassette station 200, a wafer transfer apparatus 213 is provided which is movable on a transfer path 212 extending in an X-direction. The wafer transfer apparatus 213 is movable also in a vertical direction and around a vertical axis (in a θ-direction), and can transfer the wafer W between the cassette C on each of the cassette mounting plates 211 and later-described delivery apparatuses 240 to 246 in a sixth block G6 in the treatment station 201.

In the treatment station 201, a plurality of, for example, four blocks each including various apparatuses, namely, a fourth block G4 to a seventh block G7 are provided. For example, the fourth block G4 is provided on the front side (X-direction negative direction side in FIG. 5) in the treatment station 201, and the fifth block G5 is provided on the rear side (X-direction positive direction side in FIG. 5, the upper side in the drawing) in the treatment station 201. Further, the sixth block G6 is provided on the cassette station 200 side (Y-direction negative direction side in FIG. 5) in the treatment station 201, and the seventh block G7 is provided on the interface station 203 side (Y-direction positive direction side in FIG. 5) in the treatment station 201.

In the fourth block G4, as illustrated in FIG. 6, a developing treatment apparatus 220 which performs a developing treatment on the wafer W, an intermediate-layer film forming apparatus 221 which applies a material for an intermediate-layer film onto the front surface of the wafer W to form an intermediate-layer film, for example, an organic BARC (Bottom Anti Reflecting Coating) or a Si-containing ARC, a resist coating apparatus 222 which applies a resist solution onto the front surface of the wafer W to form a resist film, and a front surface cleaning apparatus 223 which cleans the front surface of the wafer W, and the rear surface cleaning apparatus 224 which cleans the rear surface of the wafer W are arranged in this order from the bottom. For example, the developing treatment apparatus 220, the intermediate-layer film forming apparatus 221, the resist coating apparatus 222, the front surface cleaning apparatus 223, and the rear surface cleaning apparatus 224 are arranged three each side by side in the horizontal direction. Note that the numbers and the arrangements of these developing treatment apparatuses 220, intermediate-layer film forming apparatuses 221, resist coating apparatuses 222, front surface cleaning apparatuses 223, and rear surface cleaning apparatuses 224 can be arbitrarily selected.

In the fifth block G5, as illustrated in FIG. 7, thermal treatment apparatuses 230 each of which performs thermal treatments such as heating and cooling on the wafer W, hydrophobizing treatment apparatuses 231 each of which performs a hydrophobizing treatment for enhancing fixation between a resist solution and the wafer W, and edge exposure apparatuses 232 each of which exposes the outer peripheral portion of the wafer W to light, are provided side by side in the vertical direction and in the horizontal direction. Note that the numbers and the arrangements of these thermal treatment apparatuses 230, hydrophobizing treatment apparatuses 231, and edge exposure apparatuses 232 can be arbitrarily selected.

In the sixth block G6, a plurality of delivery apparatuses 240, 241, 242, 243, 244, 245, 246 are provided in order from the bottom. Further, in the seventh block G7, a plurality of delivery apparatuses 250, 251, 252 are provided in order from the bottom.

As illustrated in FIG. 5, a wafer transfer region D2 is formed in a region surrounded by the fourth block G4 to the seventh block G7. In the wafer transfer region D2, for example, a plurality of wafer transfer apparatuses 260 are arranged each of which has a transfer arm 260a movable, for example, in the Y-direction, the X-direction, the θ-direction, and the vertical direction. The wafer transfer apparatus 260 can move in the wafer transfer region D2 to transfer the wafer W to a predetermined apparatus in the fourth block G2, the fifth block G5, the sixth block G6, and the seventh block G7 therearound.

Further, in the wafer transfer region D2, a shuttle transfer apparatus 270 is provided which linearly transfers the wafer W between the sixth block G6 and the seventh block G7 as illustrated in FIG. 7. The shuttle transfer apparatus 270 is linearly movable, for example, in the Y-direction in FIG. 7. The shuttle transfer apparatus 270 moves in the Y-direction while supporting the wafer W, and can transfer the wafer W between the delivery apparatus 242 in the sixth block G6 and the delivery apparatus 252 in the seventh block G7.

As illustrated in FIG. 5, a wafer transfer apparatus 280 is provided adjacent on the X-direction positive direction side of the sixth block G6. The wafer transfer apparatus 280 has a transfer arm 280a that is movable, for example, in the X-direction, the θ-direction, and the vertical direction. The wafer transfer apparatus 280 can move up and down while supporting the wafer W to transfer the wafer W to each of the delivery apparatuses in the sixth block G6.

In the interface station 203, a wafer transfer apparatus 290 and a delivery apparatus 291 are provided. The wafer transfer apparatus 290 has a transfer arm 290a that is movable, for example, in the Y-direction, the θ-direction, and the vertical direction. The wafer transfer apparatus 290 can transfer the wafer W to/from each of the delivery apparatuses in the seventh block G7, the delivery apparatus 291, and the exposure apparatus 202, for example, while supporting the wafer W by the transfer arm 290a.

(Friction Reducing Film Forming Apparatus)

Next, the friction reducing film forming apparatus 133 will be described. In the friction reducing film forming apparatus 133, gas being a material for friction reduction (hereinafter, referred to as a "raw material gas") is deposited on the rear surface of the wafer W to form a friction reducing film on the rear surface. In the exposure apparatus 202, in the case where the outer peripheral portion of the wafer W bends downward as compared with the center portion due to raising and lowering pins as described above or in the case where the wafer W itself is not flat, the wafer W is sucked and held on a stage with stress placed on the wafer W and is deformed on the stage. Hence, in this embodiment, a friction reducing film that has a high contact angle with respect to the holding surface of the stage of the exposure apparatus 202 and reduces friction between the rear surface of the wafer W and the holding surface of the stage (friction coefficient) is formed on the rear surface of the wafer W in the friction reducing film forming apparatus 133 before exposure processing. Then, in the exposure apparatus 202, the wafer W can be mounted in a manner to slide on the stage owing to the friction reducing film, thereby reducing the above-described stress. Note that the film kind of the friction reducing film is not particularly limited as long as it reduces friction and, for example, a fluororesin film is used.

Further, forming the friction reducing film on the rear surface of the wafer W in the friction reducing film forming apparatus 133 also provides an effect of protecting the rear surface. For example, in transferring the wafer W on which the friction reducing film is formed, it is possible to restrain the rear surface of the wafer W from being scratched. Further, for example, cleaning the rear surface of the wafer W in the coating treatment, a so-called back rinse can be omitted.

Figure 8:
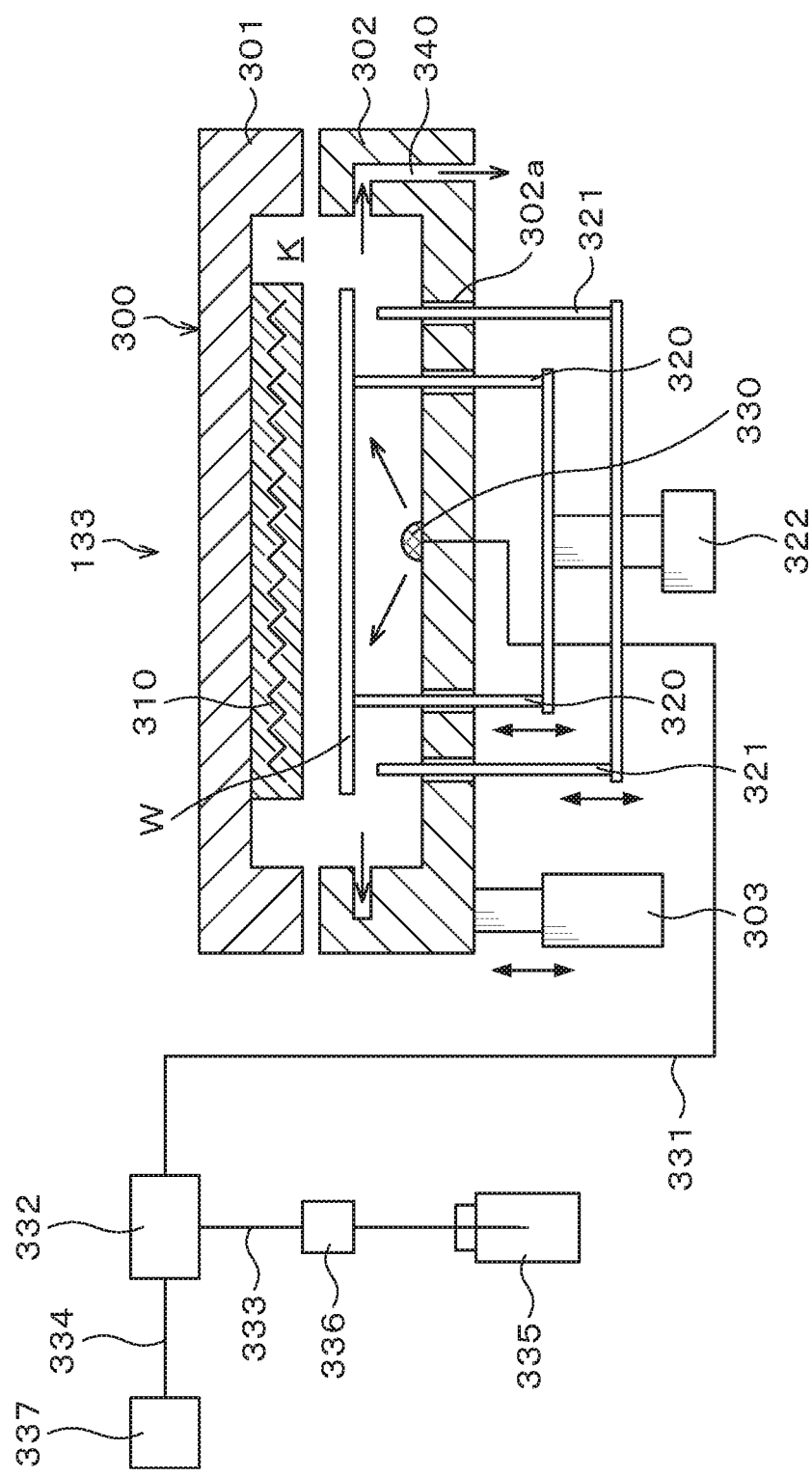
FIG. 8 is a longitudinal sectional view schematically illustrating the outline of a configuration of a friction reducing film forming apparatus.

The configuration of the friction reducing film forming apparatus 133 will be described. FIG. 8 is a longitudinal sectional view schematically illustrating the outline of the configuration of the friction reducing film forming apparatus 133.

The friction reducing film forming apparatus 133 includes a chamber 300 that houses the wafer W therein. The chamber 300 has an upper chamber 301 and a lower chamber 302. The lower chamber 302 is configured to freely rise and lower in the vertical direction by means of a raising and lowering mechanism 303. When the lower chamber 302 is raised to come close contact with the upper chamber 301, a hermetically closed treatment space K is formed inside the chamber 300. On the other hand, when the lower chamber 302 is lowered, the inside of the chamber 300 is opened to the atmosphere.

In the upper chamber 301, a heater 310 for heating the wafer W is provided.

In the lower chamber 302, two support units 320, 321 for supporting the wafer W are provided. Each of the support units 320, 321 is composed of, for example, three raising and lowering pins, and supports a different portion of the rear surface of the wafer W. The support units 320, 321 are configured to freely rise and lower in the vertical direction individually by the raising and lowering mechanism 322 as a moving mechanism. The lower chamber 302 is formed with through holes 302a formed in a thickness direction, so that the support units 320, 321 pass through the through holes 302a.

At a middle part of a bottom surface inside the lower chamber 302, a gas supply part 330 is provided which supplies the raw material gas to the rear surface of the wafer W supported by the first support unit 320 or the second support unit 321. The gas supply part 330 is configured to be able to jet the raw material gas to the entire rear surface of the wafer W.

To the gas supply part 330, a gas supply pipe 331 through which the raw material gas flows is connected. The gas supply pipe 331 is communicated with a vaporizer 332 that vaporizes raw material liquid in a liquid form to the raw material gas. To the vaporizer 332, a liquid supply pipe 333 through which the raw material liquid flows and a gas supply pipe 334 through which a nitrogen gas flows are connected. The liquid supply pipe 333 is communicated with a raw material tank 335 that stores the raw material liquid, and the liquid supply pipe 333 is provided with a pump 336 for sending the raw material liquid from the raw material tank 335 to the vaporizer 332. The gas supply pipe 334 is communicated with a nitrogen gas supply source 337 that supplies the nitrogen gas to the vaporizer 332.

Inside the vaporizer 332, a heater (not illustrated) is provided which heats and vaporizes the raw material liquid flowing therein from the raw material tank 335. In the case where the raw material gas is a fluororesin, for example, Teflon (registered trademark) resin, the heating temperature in the vaporizer 332 is, for example, 180° C. The raw material gas vaporized in the vaporizer 332 is then pressure-fed by the nitrogen gas supplied from the nitrogen gas supply source 337, and supplied to the gas supply part 330.

Inside a side wall of the lower chamber 302, an exhaust path 340 is provided which evacuates the chamber 300 (treatment space K). The exhaust path 340 is formed at a position lower than a predetermined treatment position when the wafer W supported by the first support unit 320 or the second support unit 321 is arranged at the predetermined treatment position. To the exhaust path 340, an exhaust pipe (not illustrated) is connected, and the exhaust pipe is communicated with an exhaust apparatus such as a vacuum pump.

Figure 9:
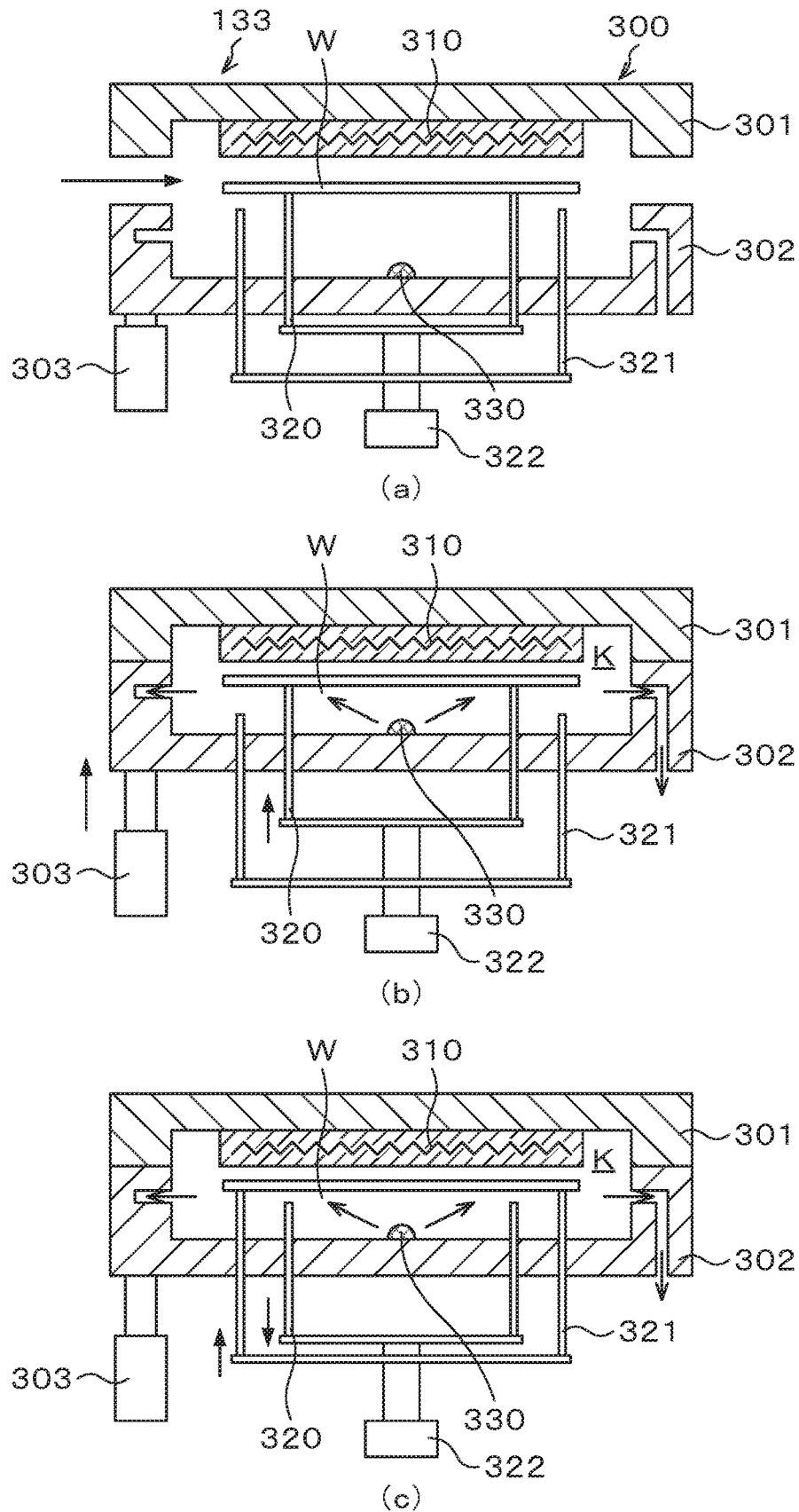
FIG. 9 is an explanatory view illustrating an appearance where a friction reducing film is formed on a rear surface of a wafer in the friction reducing film forming apparatus.

Next, a method for forming a friction reducing film performed in the friction reducing film forming apparatus 133 will be described. FIG. 9 is an explanatory view illustrating an appearance where a friction reducing film is formed on the rear surface of the wafer W in the friction reducing film forming apparatus 133.

First, as illustrated in FIG. 9(*a*), in a state where the lower chamber 302 is lowered, the wafer W is transferred to the inside of the chamber 300. The wafer W is supported by the first support unit 320.

Then, as illustrated in FIG. 9(*b*), the lower chamber 302 is raised by the raising and lowering mechanism 303 to come into close contact with the upper chamber 301 to thereby form the hermetically closed treatment space K. Further, the first support unit 320 is raised by the raising and lowering mechanism 322 to place the wafer W at the predetermined treatment position.

Thereafter, while the heater 310 is heating the wafer W to a predetermined temperature, for example, 120° C., the raw material gas is supplied from the gas supply part 330 to the rear surface of the wafer W. Then, the raw material gas is deposited on a portion other than the portion supported by the first support unit 320 on the rear surface of the wafer W and forms a friction reducing film.

Note that the heating of the wafer W by the heater 310 is performed to promote the reaction between the rear surface and the raw material gas. Therefore, the heating temperature of the wafer W is not limited to 120° C., but the effect of promoting the reaction is reduced at low temperature. Besides, in the case where the friction reducing film is a fluororesin film, the friction reducing film is decomposed, for example, at 200° C., so that the heating temperature is preferably lower than 200° C.

Thereafter, as illustrated in FIG. 9(*c*), the second support unit 321 is raised by the raising and lowering mechanism 322 to support the rear surface of the wafer W, and the first support unit 320 is lowered. Then, the raw material gas is supplied from the gas supply part 330 to the rear surface of the wafer W, whereby the raw material gas is deposited also on the portion which has been supported by the first support unit 320 in FIG. 9(*b*), namely, the portion where the friction reducing film has not been formed. Thus, the friction reducing film is formed on the entire rear surface of the wafer W.

Note that at the time when supplying the raw material gas from the gas supply part 330 as illustrated in FIG. 9(*b*), (*c*), the treatment space K is evacuated from the exhaust path 340. Then, the exhaust path 340 is formed on the lateral side and the lower side of the wafer W and therefore can restrain the raw material gas from flowing around to the front surface of the wafer W.

Further, since the entire rear surface of the wafer W is suction-held on the stage of the exposure apparatus 202, the friction reducing film is formed on the entire rear surface in this embodiment. However, for example, in the case where the stage does not suction-hold the entire rear surface, the friction reducing film only needs to be formed only on a portion to be suction-held on the rear surface of the wafer W.

Note that the configuration of the friction reducing film forming apparatus 133 in this embodiment is one example for executing the formation of the friction reducing film in this disclosure, but is not limited thereto.

(Ultraviolet Processing Apparatus)

Next, the ultraviolet processing apparatuses 134, 135 will be described. The ultraviolet processing apparatus 134 corresponds to the pre-treatment unit in this disclosure, and irradiates the rear surface of the wafer W with an ultraviolet ray before the friction reducing film is formed on the rear surface in the friction reducing film forming apparatus 133. The irradiation with the ultraviolet ray activates the rear surface of the wafer W, and thereby can appropriately form the friction reducing film and can increase the contact angle with respect to the stage of the exposure apparatus 202. Further, the ultraviolet processing apparatus 135 corresponds to the film peeling unit in this disclosure, irradiates the rear surface of the wafer W after exposure processing with the ultraviolet ray to peal the friction reducing film formed on the rear surface.

The configurations of the ultraviolet processing apparatuses 134, 135 will be described. The configurations of the ultraviolet processing apparatuses 134, 135 are the same, and therefore the configuration of the ultraviolet processing apparatus 134 will be described here. FIG. 10 is a side view schematically illustrating the outline of the configuration of the ultraviolet processing apparatus 134.

The ultraviolet processing apparatus 134 includes a spin chuck 400 and pads 401 that suction-hold the rear surface of the wafer W. The spin chuck 400 suction-holds the center portion of the rear surface of the wafer W, and the pads 401 suction-hold the rear surface of the wafer W outside the spin chuck 400. In other words, the spin chuck 400 and the pads 401 hold the different portions of the rear surface of the wafer W.

The spin chuck 400 is provided with a moving mechanism 402. The spin chuck 400 is configured to be able to rotate at a predetermined speed and freely rise and lower in the vertical direction by means of the moving mechanism 402.

The pad 401 is provided with a moving mechanism 403. The pad 401 is configured to be able to rise and lower in the vertical direction and movable in the horizontal direction by means of the moving mechanism 403.

Figure 10A:
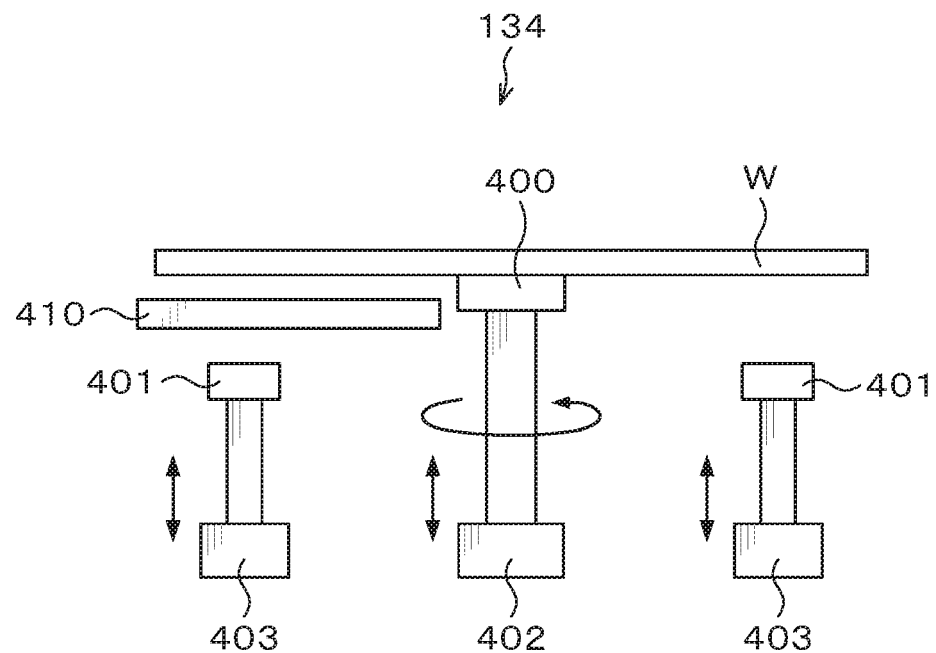
FIG. 10A is a side view schematically illustrating the outline of a configuration of an ultraviolet processing apparatus.
Figure 10B:
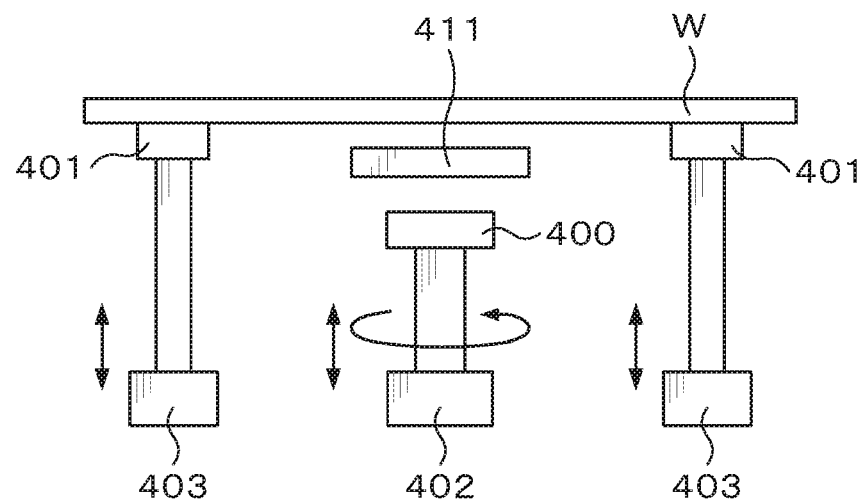
FIG. 10B is a side view schematically illustrating the outline of the configuration of the ultraviolet processing apparatus.

The ultraviolet processing apparatus 134 further includes UV lamps 410, 411 each of which irradiates the rear surface of the wafer W with an ultraviolet ray. As illustrated in FIG. 10A, the first UV lamp 410 is provided below the outer peripheral portion of the wafer W held by the spin chuck 400 and irradiates the rear surface of the wafer W with the ultraviolet ray. As illustrated in FIG. 10B, the second UV lamp 411 is provided below the center portion of the wafer W held by the pads 401 and irradiates the rear surface of the wafer W with the ultraviolet ray.

Figure 11:
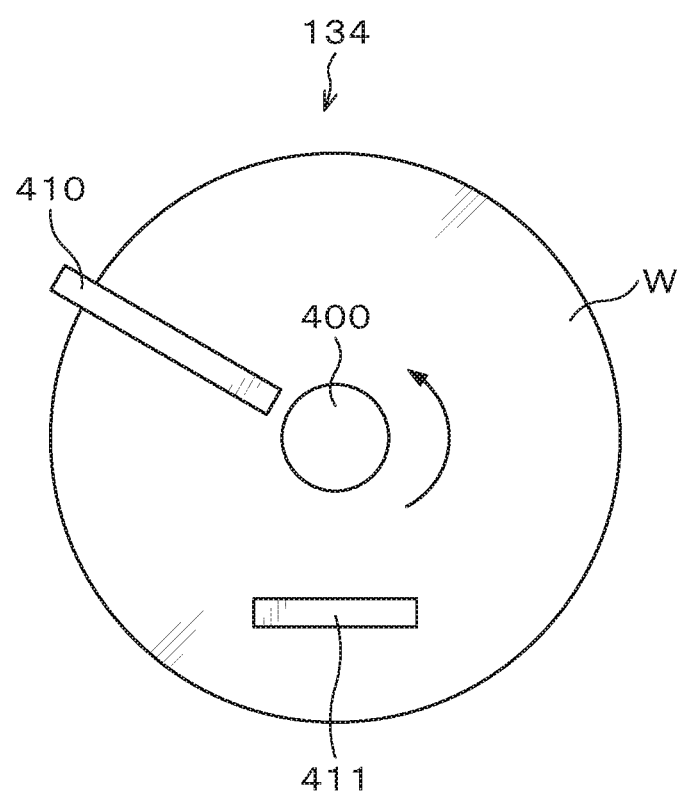
FIG. 11 is an explanatory view illustrating an appearance where the rear surface of the wafer is irradiated with an ultraviolet ray in the ultraviolet processing apparatus.
Figure 12:
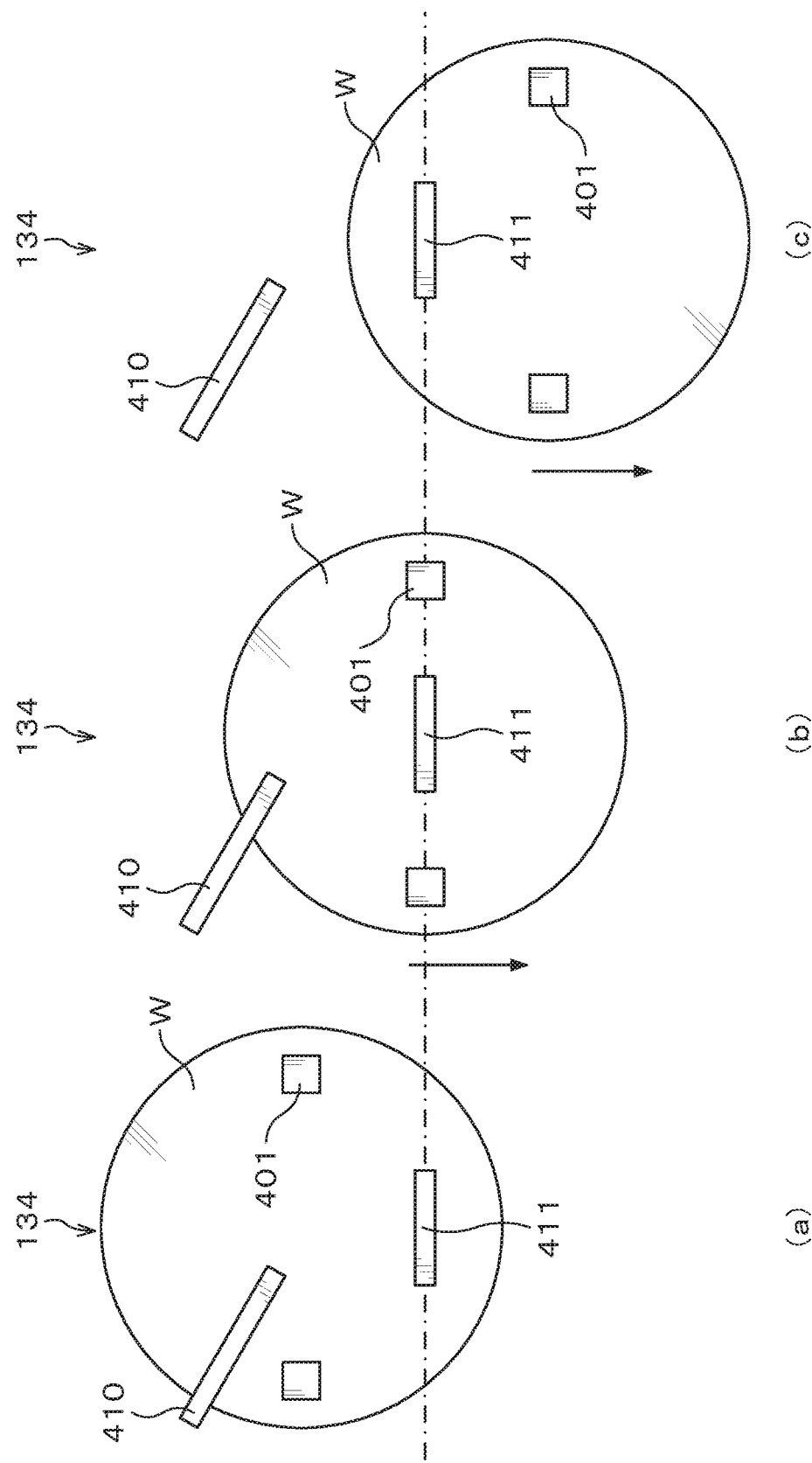
FIG. 12 is an explanatory view illustrating an appearance where the rear surface of the wafer is irradiated with the ultraviolet ray in the ultraviolet processing apparatus.

Next, an ultraviolet processing method performed in the ultraviolet processing apparatus 134 will be described. FIG. 11 and FIG. 12 are explanatory views illustrating an appearance where the rear surface of the wafer W is irradiated with the ultraviolet ray in the ultraviolet processing apparatus 134.

First, as illustrated in FIG. 11, the wafer W is suction-held by the spin chuck 400. Thereafter, while the spin chuck 400 is rotating the wafer W, the rear surface of the wafer W is irradiated with the ultraviolet ray from the first UV lamp 410. Then, a portion other than the center portion of the rear surface of the wafer W is irradiated with the ultraviolet ray. Note that in this event, the irradiation with the ultraviolet ray from the second UV lamp 411 is suspended.

Thereafter, the pads 401 are raised by the moving mechanisms 403 to suction-hold the rear surface of the wafer W, and the spin chuck 400 is lowered by the moving mechanism 402. Then, as illustrated in FIG. 12(*a*) to (*c*), while the moving mechanisms 403 are moving the wafer W held by the pads 401 in one direction in the horizontal direction, the rear surface of the wafer W is irradiated with the ultraviolet ray from the second UV lamp 411. Then, the center portion of the wafer W that has not been irradiated with the ultraviolet ray in FIG. 11 is irradiated with the ultraviolet ray. Note that in this event, the irradiation with the ultraviolet ray from the first UV lamp 410 is suspended.

Thus, the entire rear surface of the wafer W is irradiated with the ultraviolet ray. Then, in the ultraviolet processing apparatus 134, this ultraviolet processing activates the rear surface of the wafer W before formation of the friction reducing film. Besides, in the ultraviolet processing apparatus 135, this ultraviolet processing peels the friction reducing film on the rear surface of the wafer W after the exposure processing.

Note that the configurations of the ultraviolet processing apparatuses 134, 135 in this embodiment are examples for implementing the ultraviolet processing in this disclosure, but are not limited thereto.

(Wafer Treatment Method)

Figure 13:
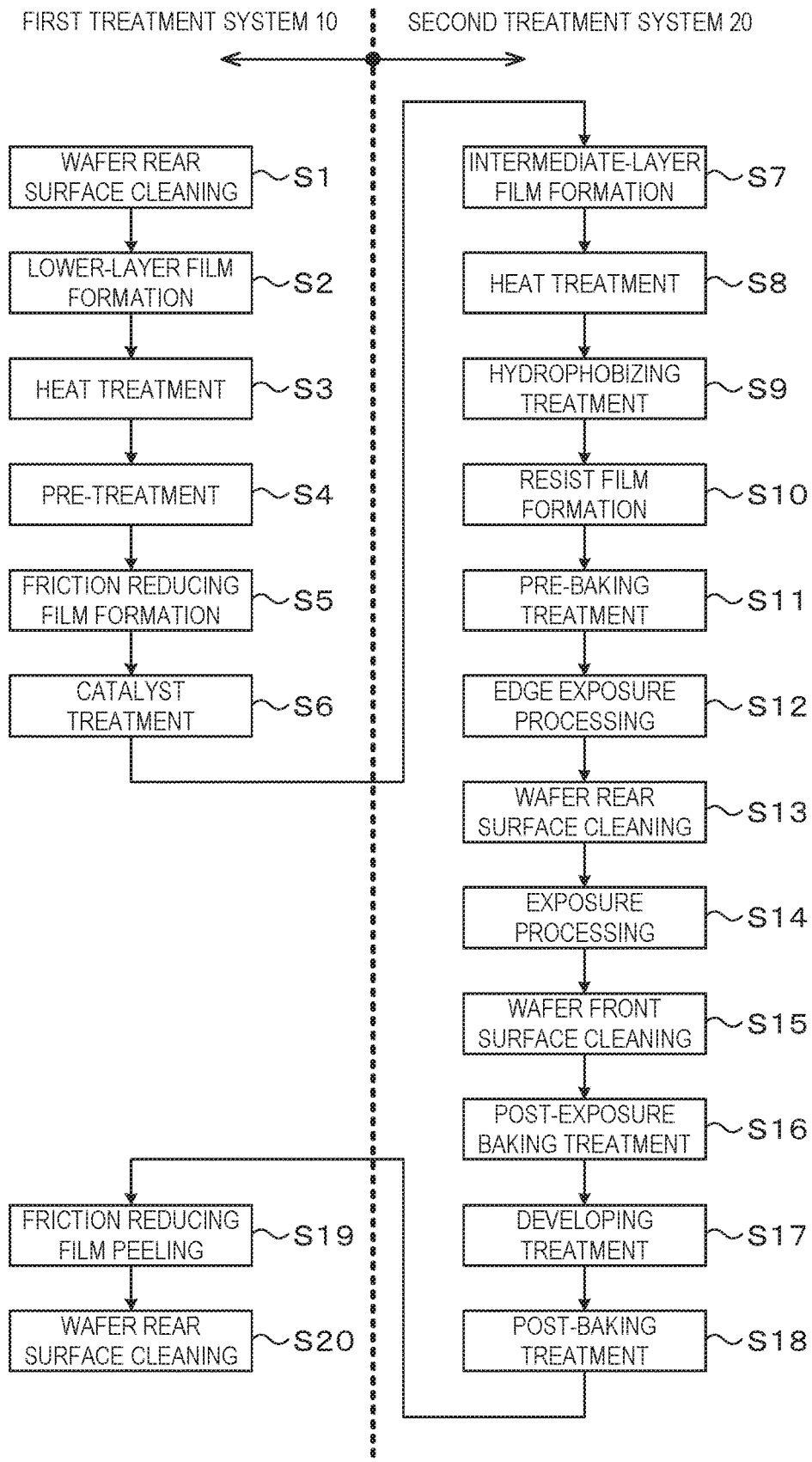
FIG. 13 is a flowchart illustrating main steps of the wafer treatment according to the first embodiment.

Next, the wafer treatment performed in the substrate treatment system 1 configured as described above will be described. FIG. 13 is a flowchart illustrating an example of main steps of the wafer treatment.

First, a cassette C housing a plurality of wafers W is transferred into the cassette station 100 of the first treatment system 10 and mounted on the cassette mounting plate 111. Then, the wafers W in the cassette C are successively taken out by the wafer transfer apparatus 113 and transferred to the delivery apparatus 140 in the treatment station 101.

The wafer W is then transferred by the wafer transfer apparatus 150 to the rear surface cleaning apparatus 120, in which the rear surface of the wafer W is cleaned (Step S1). Thereafter, the wafer W is transferred by the wafer transfer apparatus 150 to the lower-layer film forming apparatus 122, in which a lower-layer film is formed on the front surface of the wafer W (Step S2). The wafer W is thereafter transferred by the wafer transfer apparatus 150 to the thermal treatment apparatus 130 and subjected to a heat treatment (Step S3). Note that the heat treatment at Step S3 is often performed at high temperature which is often a temperature equal to or higher than, for example, a decomposition temperature of the friction reducing film formed at later-described Step S5. Therefore, the heat treatment at Step S3 is performed before formation of the friction reducing film at Step S5.

Next, the wafer W is transferred by the wafer transfer apparatus 150 to the ultraviolet processing apparatus 134 and subjected to a pre-treatment by irradiating the entire rear surface of the wafer W with the ultraviolet ray (Step S4). This pre-treatment method is as illustrated in FIG. 11 and FIG. 12. Further, in this pre-treatment, irradiating the rear surface of the wafer W with the ultraviolet ray forms OH groups (hydroxyl groups) at the end of the rear surface, thereby activating the rear surface.

Next, the wafer W is then transferred by the wafer transfer apparatus 150 to the friction reducing film forming apparatus 133, in which the friction reducing film is formed on the entire rear surface of the wafer W (Step S5). The method for forming the friction reducing film is as illustrated in FIG. 9, in which the raw material gas is deposited on the rear surface of the wafer W. Since the rear surface of the wafer W has been activated and OH groups have been formed at Step S4, the reaction of the raw material gas with respect to the rear surface is promoted when depositing the raw material gas. As a result, the contact angle of the friction reducing film with respect to the stage of the exposure apparatus 202 can be made large.

Next, the wafer W is then transferred by the wafer transfer apparatus 150 to the catalyst treatment apparatus 123, in which a catalyst is supplied to the rear surface of the wafer W to perform a catalyst treatment (Step S6). Performing the catalyst treatment can further promote the reaction between the rear surface of the wafer W and the raw material gas, and thereby shorten the treatment time. Note that in the case where the reaction sufficiently occurs at the above-described Step S5, the catalyst treatment at Step S6 may be omitted.

Next, the wafer W is then transferred by the wafer transfer apparatus 150 to the delivery apparatus 141, and transferred by the wafer transfer apparatus 113 to the cassette C on the predetermined cassette mounting plate 111. Thereafter, the cassette C housing the wafers W for which the treatments in the first treatment system 10 are completed is transferred to the second treatment system 20.

In the second treatment system 20, the cassette C is transferred into the cassette station 200 and mounted on the cassette mounting plate 211. Then, the wafers W in the cassette C are successively taken out by the wafer transfer apparatus 213 and transferred to the delivery apparatus 242 in the treatment station 201.

Next, the wafer W is transferred by the wafer transfer apparatus 260 to the intermediate-layer film forming apparatus 221, in which an intermediate-layer film is formed on the front surface of the wafer W (Step S7). The wafer W is then transferred by the wafer transfer apparatus 260 to the thermal treatment apparatus 230 and subjected to a heat treatment (Step S8). The wafer W is thereafter returned by the wafer transfer apparatus 260 to the delivery apparatus 242.

The wafer W is then transferred by the wafer transfer apparatus 280 to the delivery apparatus 243. The wafer W is thereafter transferred by the wafer transfer apparatus 260 to the hydrophobizing treatment apparatus 231 and subjected to a hydrophobizing treatment (Step S9). The wafer W is then transferred by the wafer transfer apparatus 260 to the resist coating apparatus 222, in which a resist film is formed on the wafer W (Step S10). The wafer W is thereafter transferred by the wafer transfer apparatus 260 to the thermal treatment apparatus 230 and subjected to a pre-baking treatment (Step S11). The wafer W is thereafter returned by the wafer transfer apparatus 260 to the delivery apparatus 243.

The wafer W is then transferred by the wafer transfer apparatus 280 to the delivery apparatus 245. Thereafter, the wafer W is transferred by the wafer transfer apparatus 260 to the edge exposure apparatus 232 and subjected to edge exposure processing (Step S12). The wafer W is thereafter transferred by the wafer transfer apparatus 260 to the rear surface cleaning apparatus 224, in which the rear surface of the wafer W is cleaned (Step S13). The wafer W is thereafter returned by the wafer transfer apparatus 260 to the delivery apparatus 245.

Then, the wafer W is transferred by the wafer transfer apparatus 280 to the delivery apparatus 242, and transferred by the shuttle transfer apparatus 270 to the delivery apparatus 252. The wafer W is thereafter transferred by the wafer transfer apparatus 290 to the exposure apparatus 202 and subjected to exposure processing in a predetermined pattern (Step S14). In the exposure apparatus 202, the wafer W is mounted on the stage by the raising and lowering pins. In this event, since the wafer W supported by the raising and lowering pins bends downward under its own weight at the outer peripheral portion as compared with the center portion, the wafer W is mounted on the stage in sequence from the outer peripheral portion toward the center portion. Since the friction reducing film is formed on the rear surface of the wafer W, the wafer W can be mounted in a manner to slide on the stage, thereby reducing the stress placed on the wafer W as in the prior art. Accordingly, it is possible to suction-hold the wafer W at the appropriate position on the stage, and thereby restrain the displacement, from the normal position, of the position where the wafer W is exposed to light.

Next, the wafer W is transferred by the wafer transfer apparatus 290 to the delivery apparatus 252. Thereafter, the wafer W is transferred by the wafer transfer apparatus 260 to the front surface cleaning apparatus 223, in which the front surface of the wafer W is cleaned (Step S15). In the case where the exposure processing at Step S14 is liquid-immersion exposure, cleaning the front surface of the wafer W removes the treatment solution used in the exposure processing. The wafer W is then transferred by the wafer transfer apparatus 260 to the thermal treatment apparatus 230 and subjected to a post-exposure baking treatment (Step S16). Thereafter, the wafer W is transferred by the wafer transfer apparatus 260 to the developing treatment apparatus 220 and subjected to a developing treatment (Step S17). Thereafter, the wafer W is transferred by the wafer transfer apparatus 260 to the thermal treatment apparatus 230 and subjected to a post-baking treatment (Step S18).

Next, the wafer W is transferred by the wafer transfer apparatus 260 to the delivery apparatus 240, and further transferred by the wafer transfer apparatus 213 to the cassette C on the predetermined cassette mounting plate 211. Thereafter, the cassette C housing the wafers W for which the treatments in the second treatment system 20 are completed is transferred to the first treatment system 10.

In the first treatment system 10, the cassette C is transferred into the cassette station 100 and mounted on the cassette mounting plate 111. Then, the wafers W in the cassette C are successively taken out by the wafer transfer apparatus 113 and transferred to the delivery apparatus 140 in the treatment station 101.

Next, the wafer W is transferred by the wafer transfer apparatus 150 to the ultraviolet processing apparatus 135, in which the entire rear surface of the wafer W is irradiated with the ultraviolet ray, whereby the friction reducing film on the rear surface is peeled (Step S19). Concretely, the ultraviolet irradiation breaks the bond between the OH groups on the rear surface of the wafer W and the friction reducing film to peel the friction reducing film. The method for peeling the friction reducing film is as illustrated in FIG. 11 and FIG. 12. Peeling the friction reducing film from the rear surface of the wafer W as described above can restrain the influence on the substrate steps, for example, restrain the rear surface of the wafer W from becoming difficult to clean.

Next, the wafer W is transferred to the rear surface cleaning apparatus 121, in which the rear surface of the wafer W is cleaned (Step S20). Concretely, supplying cleaning liquid, for example, IPA to the rear surface of the wafer W cleans the rear surface of the wafer W. At the above-described Step S19, particles may occur depending on the kind of the friction reducing film, and the particles are removed at Step S20. Accordingly, in a process in which the rear surface of the wafer W is kept clean before Step S20, the cleaning treatment at Step S20 may be omitted.

Next, the wafer W is transferred by the wafer transfer apparatus 150 to the delivery apparatus 141, and transferred by the wafer transfer apparatus 113 to the cassette C on the predetermined cassette mounting plate 111. Thus, a series of wafer treatments in the substrate treatment system 1 ends.

According to this embodiment, forming the friction reducing film on the rear surface of the wafer W at Step S5 ensures that when the wafer W is mounted on the stage in the exposure processing at Step S14 thereafter, the friction reducing film formed on the rear surface of the wafer W comes into contact with the stage. Then, for example, even in the case where the outer peripheral portion of the wafer W bends downward as compared with the center portion due to raising and lowering pins of the exposure apparatus 202 or in the case where the wafer W itself to be transferred to the exposure apparatus 202 is not flat, the wafer W can be mounted in a manner to slide on the stage owing to the friction reducing film, thereby reducing the stress placed on the wafer W as in the prior art. Accordingly, it is possible to suction-hold the wafer at the appropriate position on the stage, and thereby restrain the displacement, from the normal position, of the position where the wafer W is exposed to light at Step S14. As a result, overlay of the exposure processing can be improved.

The present inventors verified the effect in this embodiment. In this verification, the fluororesin film was used for the friction reducing film. First, the effect of the friction reducing film was verified. When the friction reducing film was actually formed on the rear surface of the wafer W and the friction coefficient was measured, the friction coefficient reduced by about 70% as compared with the case where the rear surface of the wafer W was subjected to no treatment (bare silicon).

Next, as the effect of improving the overlay of the exposure processing, the effect of improving the distortion of the wafer W (distortion in the vertical direction) was verified. In this verification, the distortion when the wafer W was suction-held on the stage of the exposure apparatus 202 was measured for the case where the friction reducing film was formed on the rear surface of the wafer W and the case where the friction reducing film was not formed. A warpage of 300 µm, namely, a warpage to make the distance between the upper surface of the top portion and the lower surface of the bottom portion of the wafer 300 µm was imparted to the wafer W. Further, on the exposure apparatus 202 side, verification was made in four patterns such as in the case where nothing was corrected, the case where 10 parameters were corrected, the case where 33 parameters were corrected, and the case where the CPE was corrected.

When 3σ of the distortion within the wafer was measured, the 3σ of the distortion was improved in the case where the friction reducing film was formed on the rear surface of the wafer W as compared with the case where the friction reducing film was not formed. Concretely, in the case where nothing was corrected and the case where 10 parameters were corrected on the exposure apparatus 202 side, the 3σ of the distortion was improved by about 20%. In the case where 33 parameters were corrected, the 3σ of the distortion was improved by about 10%, and even in the case where the CFE was corrected, the 3σ of the distortion was improved by about 1%. Accordingly, it has been found that when the friction reducing film is formed on the rear surface of the wafer W, the overlay of the exposure processing is improved.

Further, the exposure processing was carried out 10 times under the above condition and the distortion was measured, and the 3σ of the measured result for 10 times was calculated. Basically, exposure processing was carried out 10 times on the same wafer W, the measured result of the distortion in each time should be the same. However, actually, when the wafer W to be transferred to the exposure apparatus 202 bends, the measured result varies depending on how the wafer W comes into contact with the stage, for example, whether the wafer W comes into contact with the stage from the right side or from the left side, when mounting the wafer W on the stage by the raising and lowering pins. Hence, the 3σ of the measured result for 10 times was calculated. As a result, even when the correction of the exposure apparatus 202 is in any of the cases, the 3σ of the measured result for 10 times was improved in the case where the friction reducing film was formed on the rear surface of the wafer W as compared with the case where the friction reducing film was not formed. Accordingly, it has been found that when the friction reducing film is formed on the rear surface of the wafer W, the repeatability of the overlay improvement of the exposure processing is also improved.

Second Embodiment

Figure 14:
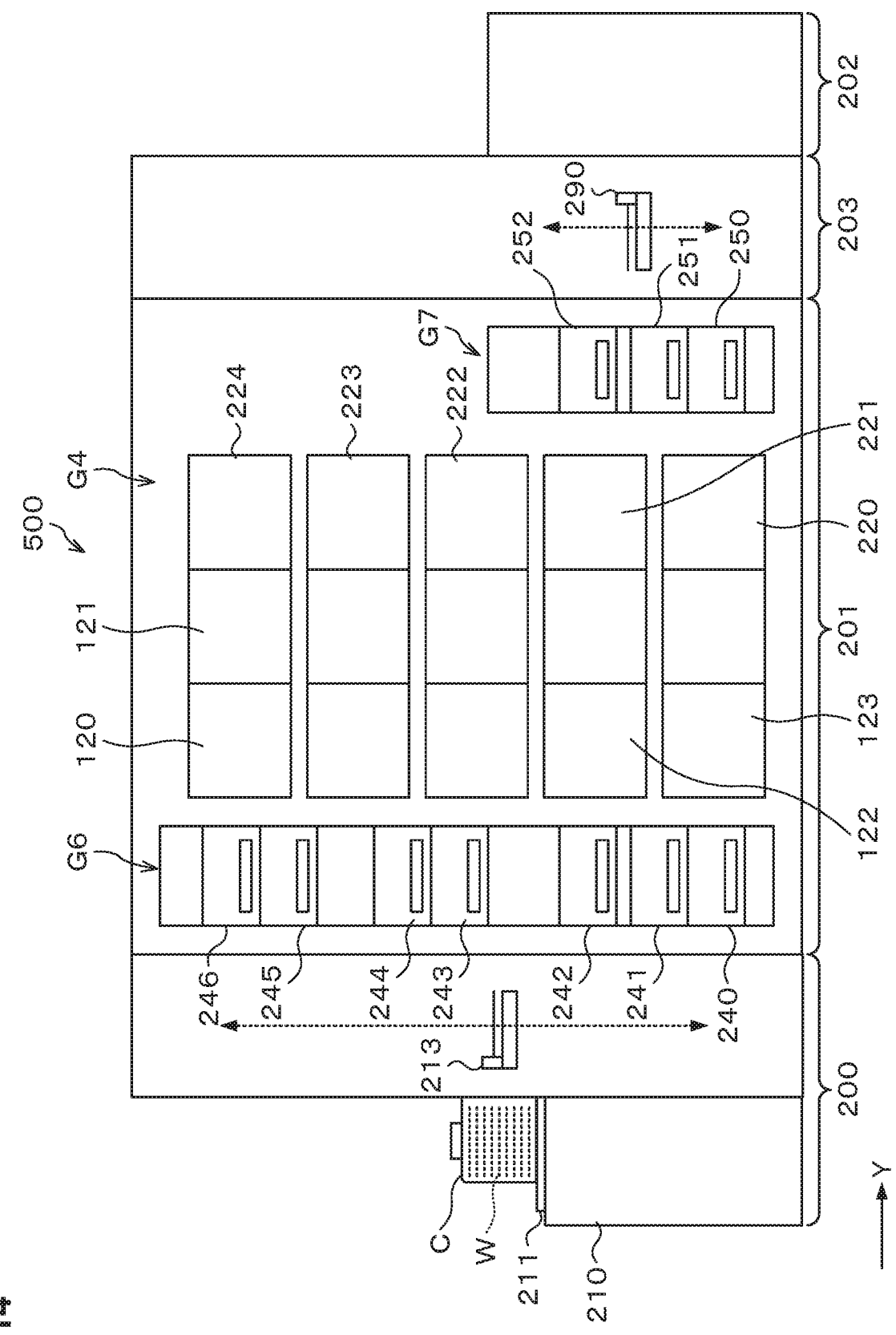
FIG. 14 is a front view schematically illustrating the outline of the internal configuration of a substrate treatment system according to a second embodiment.
Figure 15:
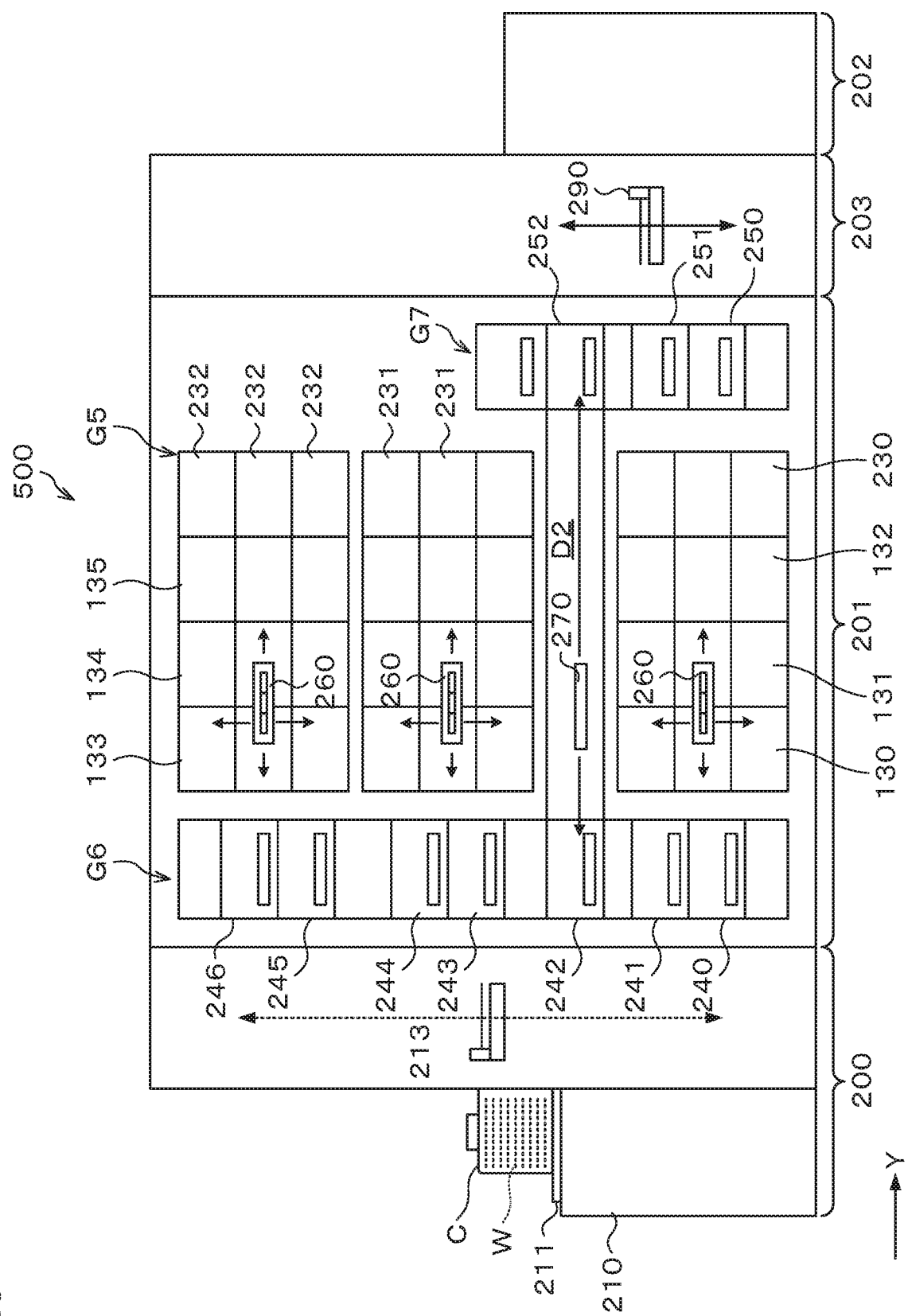
FIG. 15 is a rear view schematically illustrating the outline of the internal configuration of the substrate treatment system according to the second embodiment.

Next, a configuration of a substrate treatment system (substrate treatment apparatus in this disclosure) according to a second embodiment will be described. FIG. 14 and FIG. 15 are a front view and a rear view schematically illustrating the outline of the internal configuration of a substrate treatment system 500, respectively.

The substrate treatment system 500 in the second embodiment is made by uniting the first treatment system 10 and the second treatment system 20 in the first embodiment into one system. More specifically, the substrate treatment system 500 is configured based on the second treatment system 20 and made by installing the apparatuses of the first treatment system 10 in the second treatment system 20.

As illustrated in FIG. 14, the rear surface cleaning apparatuses 120, 121, the lower-layer film forming apparatus 122, and the catalyst treatment apparatus 123 are provided in the fourth block G4. Note that the numbers and the arrangements of these rear surface cleaning apparatuses 120, 121, lower-layer film forming apparatus 122, and catalyst treatment apparatus 123 can be arbitrarily selected.

As illustrated in FIG. 15, the thermal treatment apparatuses 130 to 132, the friction reducing film forming apparatus 133, and the ultraviolet processing apparatuses 134, 135 are arranged in the fifth block G5. Note that the numbers and the arrangements of these thermal treatment apparatuses 130 to 132, friction reducing film forming apparatus 133, and ultraviolet processing apparatuses 134, 135 can be arbitrarily selected.

Figure 16:
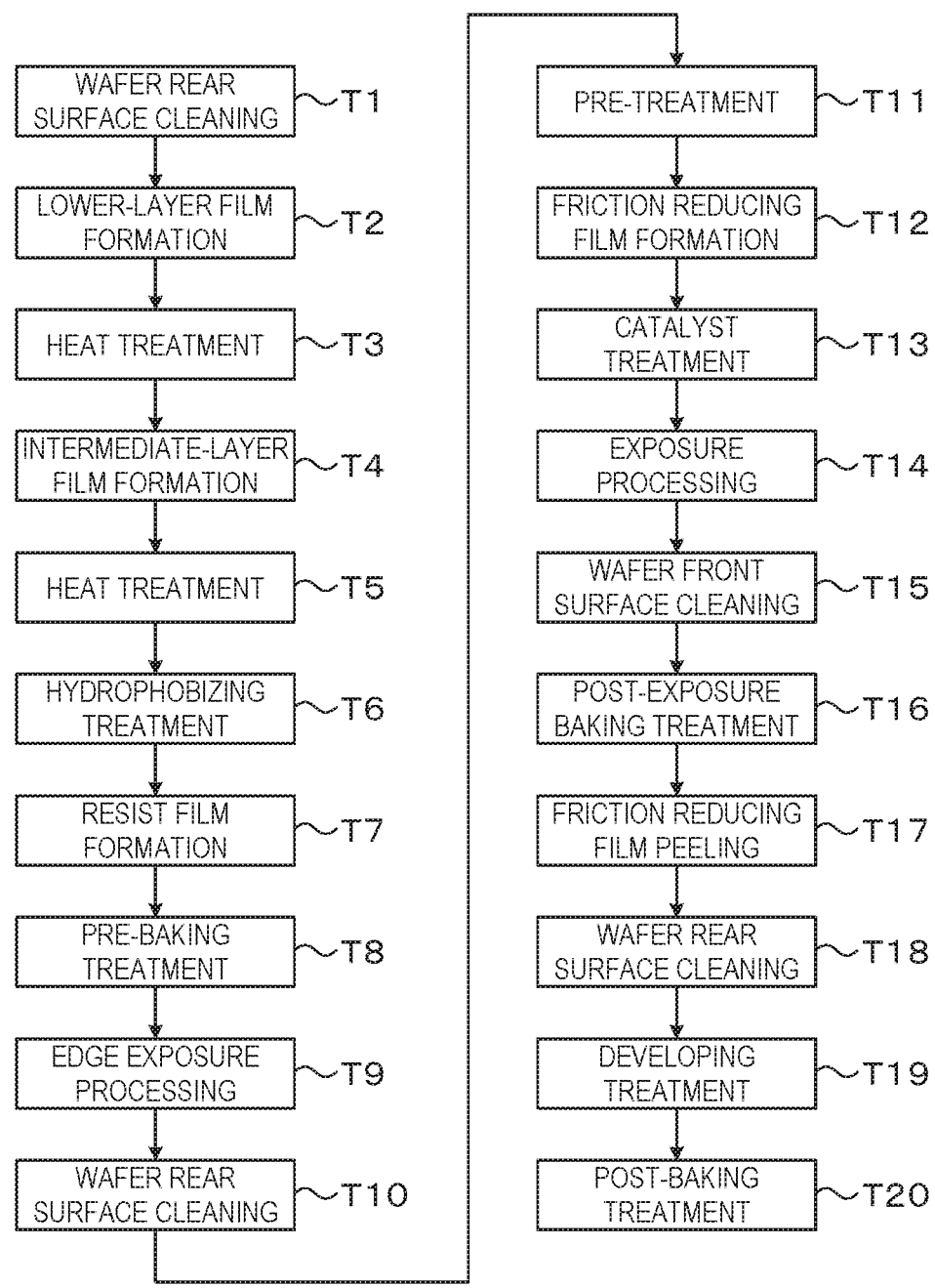
FIG. 16 is a flowchart illustrating main steps of the wafer treatment according to the second embodiment.

Next, the wafer treatment performed in the substrate treatment system 500 configured as described above will be described. FIG. 16 is a flowchart illustrating an example of main steps of the wafer treatment.

The treatment contents at Steps T1 to T20 in the second embodiment are the same as the treatment contents at Steps S1 to S20 in the first embodiment. However, in the second embodiment, the one substrate treatment system 500 is used, and therefore the order of the steps is different from that in the first embodiment.

In the second embodiment, first, cleaning of the rear surface of the wafer W (Step T1), lower-layer film formation (Step T2), and heat treatment (Step T3) are successively performed. These Steps T1 to T3 are the same steps as Steps S1 to S3 in the first embodiment, respectively.

Next, intermediate-layer film formation (Step T4), heat treatment (Step T5), hydrophobizing treatment (Step T6), resist film formation (Step T7), pre-baking treatment (Step T8), edge exposure processing (Step T9), and cleaning of the rear surface of the wafer W (Step T10) are successively performed. These Steps T4 to T10 are the same steps as Steps S7 to S13 in the first embodiment, respectively.

Next, pre-treatment by irradiation with an ultraviolet ray (Step T11), friction reducing film formation (Step T12), and catalyst treatment (Step T13) are successively performed. These Steps T11 to T13 are the same steps as Steps S4 to S6 in the first embodiment, respectively.

Next, exposure processing (Step T14), cleaning of the front surface of the wafer W (Step T15), and post-exposure baking treatment (Step T16) are successively performed. These Steps T14 to T16 are the same steps as Steps S14 to S16 in the first embodiment, respectively.

Next, friction reducing film peeling (Step T17) and cleaning of the rear surface of the wafer W (Step T18) are successively performed. These Steps T17 to T18 are the same steps as Steps S19 to S20 in the first embodiment, respectively.

Next, developing treatment (Step T19) and post-baking treatment (Step T20) are successively performed. These Steps T19 to T20 are the same steps as Steps S17 to S18 in the first embodiment, respectively. Thus, a series of treatments in the substrate treatment system 500 ends.

As described above, the wafer treatment in the second embodiment is different from the first embodiment in the order of performing the pre-treatment (Step T11), friction reducing film formation (Step T12), and catalyst treatment (Step T13). When these Steps T11 to T13 are performed before the exposure processing at Step T14, the same effect as that in the first embodiment can be provided to improve the overlay in the exposure processing. In addition, since Steps T11 to T13 are performed directly before the exposure processing at Step T14 in this embodiment, it is possible to restrain the influence of the friction reducing film formed on the rear surface of the wafer W on the other steps.

Note that in this embodiment, the pre-treatment at Step T11 is performed after the hydrophobizing treatment at Step T6. In this hydrophobizing treatment, the treatment gas is supplied to the front surface of the wafer W, and the treatment gas may flow around to the rear surface of the wafer W. In this case, the contact angle increases partially at a portion subjected to the hydrophobizing treatment on the rear surface of the wafer W, resulting in overlay occurring in the exposure processing at Step T14. In this regard, when the pre-treatment performed by irradiation with an ultraviolet ray after the hydrophobizing treatment as in this embodiment, the hydrophobized portion on the rear surface of the wafer W can be removed, making it possible to improve the overlay of the exposure processing.

Further, the wafer treatment in the second embodiment is different from the first embodiment in the order of performing the friction reducing film peeling (Step T17) and the cleaning of the rear surface of the wafer W (Step T18). Taking the influence of the friction reducing film on the other steps into consideration, it is preferable to perform these Steps T17 to T18 directly after the exposure processing at Step T14. However, the time from the finish of the exposure processing at Step T14 to performance of the cleaning of the front surface of the wafer W at Step T15 and the post-exposure baking treatment at Step T16 is fixed, the peeling of the friction reducing film is performed after the post-exposure baking treatment in this embodiment.

Other Embodiments

The raw material gas is deposited on the wafer W in the friction reducing film forming apparatus 133 in the above embodiment, but a friction reducing material may be applied on the rear surface of the wafer W. In this case, for example, in a state where the end portion of the wafer W is held, a sponge filled with the friction reducing material is pressed against the rear surface of the wafer W to apply again the friction reducing material. Further, for example, a spin-coating method may be used to supply and apply the friction reducing material to a center portion on the rear surface of the wafer W while rotating the wafer W. However, in any case, it is preferable to perform a heat treatment on the wafer W after the application of the friction reducing material.

Besides, the rear surface of the wafer W is irradiated with the ultraviolet ray in the ultraviolet processing apparatus 135 to peel the friction reducing film in the above embodiment, the method for peeling the friction reducing film is not limited to this. For example, cleaning liquid may be supplied to the rear surface of the wafer W to remove the friction reducing film.

The technique according to this disclosure is useful in applying a coating solution to a front surface of a substrate and developing an exposed coating film on the front surface of the substrate.

It should be understood that the embodiments disclosed this time are examples but not restrictive in all aspects. The above embodiments may be subjected to omission, replacement, change in various forms without departing from appended claims and their spirits.

What is claimed is:

1. A substrate treatment apparatus used for a substrate treatment system in which a substrate is treated in sequence by exposure processing, post-exposure baking, film peeling, and then cleaning of a substrate rear surface in a rear surface cleaning unit, the substrate treatment apparatus being for applying a coating solution to a front surface of the substrate and developing an exposed coating film on the front surface of the substrate, the substrate treatment apparatus comprising:
   a film forming unit configured to form a friction reducing film on a rear surface of the substrate before exposure processing, the film forming unit having a gas deposition chamber or a solution coating chamber, the friction reducing film reducing friction between the rear surface of the substrate and a holding surface for holding the rear surface of the substrate in the exposure processing, and
   a film peeling unit configured to peel the friction reducing film from the substrate, which has been subjected to the exposure processing, after the exposure processing and a postexposure baking treatment are performed on the substrate and before cleaning of the rear surface of the substrate is performed to remove particles occurring from peeling.

2. The substrate treatment apparatus according to claim 1, wherein the film forming unit forms the friction reducing film on the rear surface of the substrate after completion of a coating treatment of the coating solution to the front surface of the substrate and before the exposure processing.

3. The substrate treatment apparatus according to claim 1, wherein the friction reducing film is a fluororesin film.

4. The substrate treatment apparatus according to claim 1, wherein the film forming unit deposits a material for the friction reducing film on the rear surface of the substrate.

5. The substrate treatment apparatus according to claim 1, wherein the film forming unit applies a material for the friction reducing film on the rear surface of the substrate.

6. The substrate treatment apparatus according to claim 1, wherein
   the film peeling unit peels the friction reducing film from the substrate subjected to the exposure processing after the friction reducing film is formed on the rear surface thereof, the film peeling unit having an ultraviolet treatment chamber.

7. The substrate treatment apparatus according to claim 6, wherein the film peeling unit peels the friction reducing film after a post-exposure baking treatment is performed on the substrate and before a developing treatment is performed on the substrate.

8. The substrate treatment apparatus according to claim 6, wherein the film peeling unit peels the friction reducing film by irradiating the rear surface of the substrate with an ultraviolet ray.

9. A substrate treatment method used for a substrate treatment system in which a substrate is treated in sequence by exposure processing, post-exposure baking, film peeling, and then cleaning of a substrate rear surface in a rear surface cleaning unit, the substrate treatment method being for applying a coating solution to a front surface of the substrate and developing an exposed coating film on the front surface of the substrate, the substrate treatment method comprising
   a film forming step of forming, using a film forming unit, a friction reducing film on a rear surface of the substrate before exposure processing, the film forming unit having a gas deposition chamber or a solution coating chamber, the friction reducing film reducing friction between the rear surface of the substrate and a holding surface for holding the rear surface of the substrate in the exposure processing, and
   a film peeling step of peeling, using a film peeling unit, the friction reducing film from the substrate, which has been subjected to the exposure processing, after the exposure processing and a post exposure baking treatment are performed on the substrate and before cleaning of the rear surface of the substrate is performed to remove particles occurring from peeling.

10. The substrate treatment method according to claim 9, wherein the film forming step is performed after completion of a coating treatment of the coating solution to the front surface of the substrate and before the exposure processing.

11. The substrate treatment method according to claim 9, wherein the friction reducing film is a fluororesin film.

12. The substrate treatment method according to claim 9, wherein in the film forming step, a material for the friction reducing film is deposited on the rear surface of the substrate.

13. The substrate treatment method according to claim 9, wherein in the film forming step, a material for the friction reducing film is applied on the rear surface of the substrate.

14. The substrate treatment method according to claim 9, wherein in the film forming step, the friction reducing film is formed on the rear surface of the substrate while supporting a part of the rear surface of the substrate and by changing a portion to be supported of the rear surface of the substrate.

15. The substrate treatment method according to claim 9, further comprising
   a film peeling step of peeling the friction reducing film from the substrate subjected to the exposure processing after the friction reducing film is formed on the rear surface thereof in the film forming step.

16. The substrate treatment method according to claim 15, wherein the film forming step is performed after a post-exposure baking treatment is performed on the substrate and before a developing treatment is performed on the substrate.

17. The substrate treatment method according to claim 15, wherein at the film peeling step, the friction reducing film is peeled by irradiating the rear surface of the substrate with an ultraviolet ray.

18. The substrate treatment method according to claim 9, further comprising
a pre-treatment step of irradiating the rear surface of the substrate with an ultraviolet ray before the film forming step.

* * * * *